United States Patent
Mihara et al.

(10) Patent No.: US 7,378,645 B2
(45) Date of Patent: May 27, 2008

(54) OPTICAL SENSOR MODULE WITH SEMICONDUCTOR DEVICE FOR DRIVE

(75) Inventors: Ichiro Mihara, Tachikawa (JP); Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 127 days.

(21) Appl. No.: 11/043,886

(22) Filed: Jan. 26, 2005

(65) Prior Publication Data

US 2005/0161587 A1 Jul. 28, 2005

(30) Foreign Application Priority Data

Jan. 27, 2004 (JP) ............................. 2004-018538
Jan. 27, 2004 (JP) ............................. 2004-018540

(51) Int. Cl.
H01L 5/02 (2006.01)
H01L 40/14 (2006.01)

(52) U.S. Cl. .................................. 250/239; 250/214 R

(58) Field of Classification Search ................ 250/214, 250/214 R, 214.1, 216, 239, 208.1; 257/448, 257/457, 459, 434, 621, 290–292, 432–437
See application file for complete search history.

(56) References Cited

U.S. PATENT DOCUMENTS

| 5,289,002 A * | 2/1994 | Tarn ............................. 250/239 |
| 5,442,169 A | 8/1995 | Kunz |
| 5,859,423 A * | 1/1999 | Shimoyama et al. ..... 250/214.1 |
| 5,952,714 A | 9/1999 | Sano et al. |
| 6,137,102 A | 10/2000 | Späth et al. |
| 7,091,571 B1 * | 8/2006 | Park et al. .................... 257/432 |
| 2002/0027281 A1 * | 3/2002 | Goto ............................ 257/693 |
| 2002/0044215 A1 | 4/2002 | Takagi et al. |
| 2003/0230804 A1 | 12/2003 | Kouno et al. |
| 2004/0195492 A1 * | 10/2004 | Hsin ........................ 250/214.1 |
| 2005/0012024 A1 * | 1/2005 | Hsieh et al. ............... 250/208.1 |

FOREIGN PATENT DOCUMENTS

| CN | 1192289 A | 9/1998 |
| JP | 11-261044 A | 9/1999 |
| JP | 2001-351997 A | 12/2001 |
| JP | 2002-246756 A | 8/2002 |
| JP | 2002-290842 A | 10/2002 |
| JP | 2002-299595 A | 10/2002 |
| JP | 2002-368949 A | 12/2002 |
| JP | 2002-368950 A | 12/2002 |
| JP | 2003-110945 A | 4/2003 |
| JP | 2003-264274 A | 9/2003 |
| JP | 2004-006564 A | 1/2004 |
| JP | 2004-015427 A | 1/2004 |
| TW | 380251 | 1/2000 |

* cited by examiner

*Primary Examiner*—Que Tan Le
*Assistant Examiner*—Don Williams
(74) *Attorney, Agent, or Firm*—Frishauf, Holtz, Goodman, Chick, P.C.

(57) ABSTRACT

An optical sensor with an upper surface having a photoelectric conversion device area and connection pads connected to the photoelectric conversion device area thereof; a semiconductor structure which has a plurality of electrodes for external connection; an insulating layer formed on the periphery of the semiconductor structure; and a first wiring formed on at least one of the semiconductor structure and the optical sensor and connecting at least one of the electrodes for external connection of the semiconductor structure to one of the connection pads of the optical sensor.

35 Claims, 40 Drawing Sheets

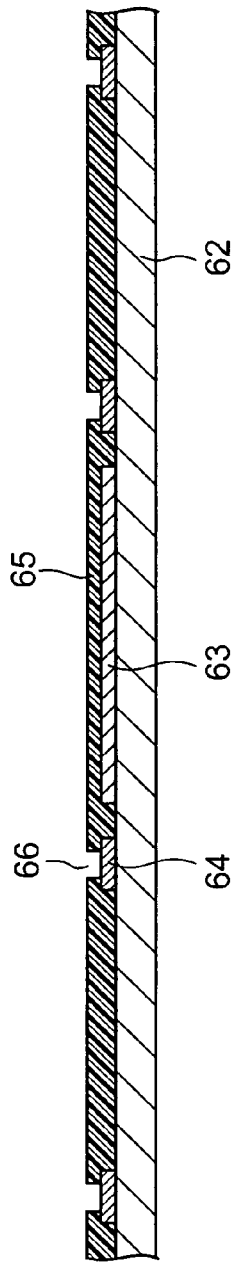
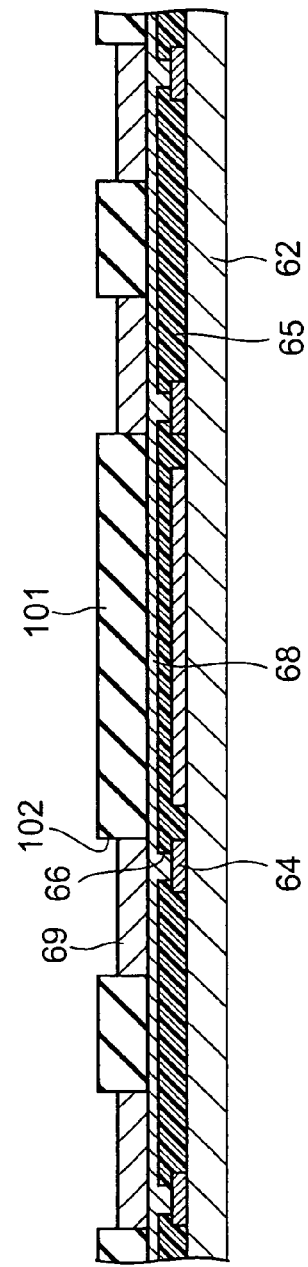

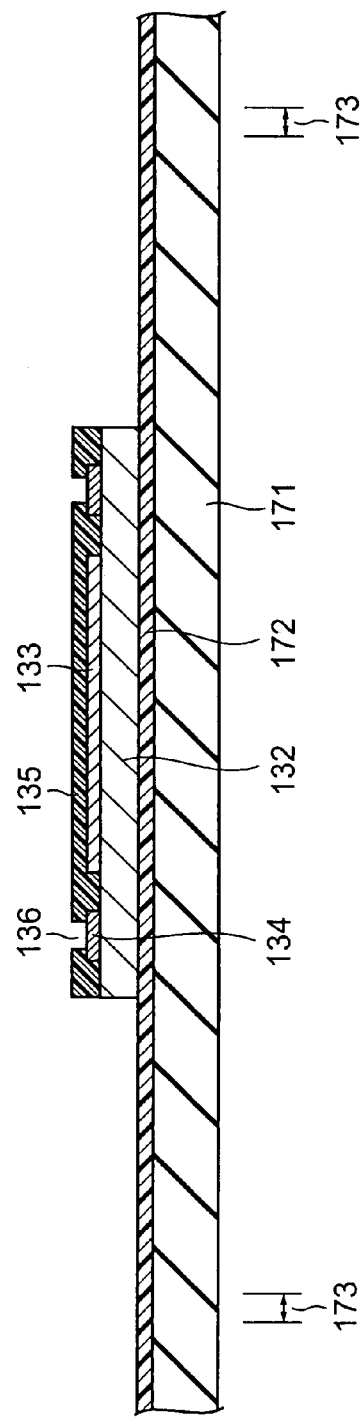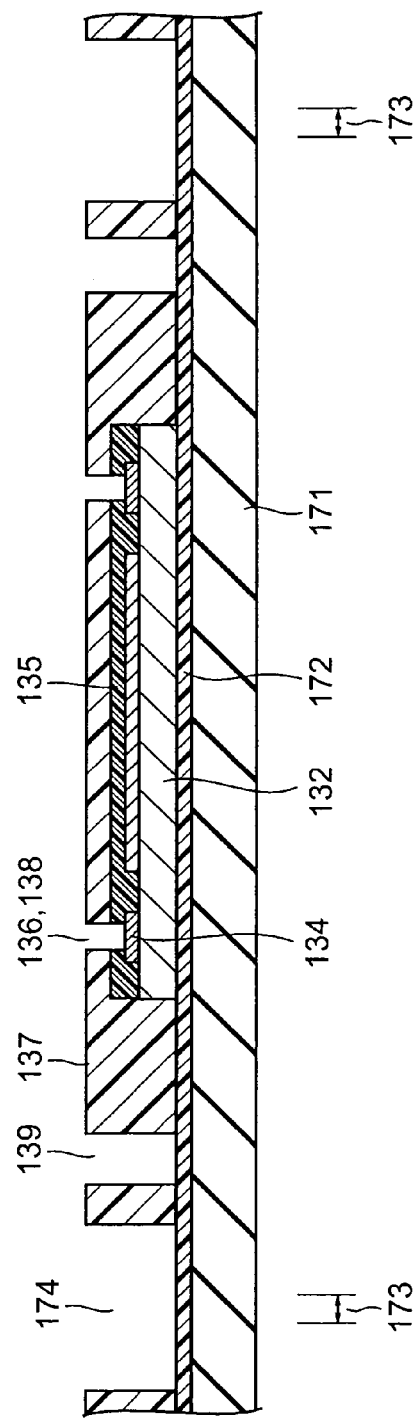

OPTICAL SENSOR MODULE WITH SEMICONDUCTOR DEVICE FOR DRIVE

CROSS-REFERENCE TO RELATED APPLICATIONS

This application is based upon and claims the benefit of priority from the prior Japanese Patent Applications No. 2004-018538, filed Jan. 27, 2004 and No. 2004-018540, filed Jan. 27, 2004, the entire contents of which is incorporated herein by reference.

BACKGROUND OF THE INVENTION

1. Field of the Invention

The present invention relates to an optical sensor module, and more particularly, an optical sensor module having a semiconductor device for drive.

2. Description of the Related Art

A conventional optical sensor module described in Japanese Laid-Open Patent Application No. 2003-264274 titled "CAMERA MODULE" has a configuration, in which an optical sensor is situated on the upper surface of a hard circuit board being a thick plate having a function as a supporting component; and chip components composed of a semiconductor device having a function as a peripheral drive circuit of the optical sensor, resistors, capacitors, etc., are provided on the lower surface of the circuit board; and the chip components composed of the semiconductor device, the resistors, the capacitors, etc. are covered with a sealing film.

As mentioned above, at the conventional optical sensor module, the optical sensor is situated on the upper surface of the circuit board of the thick plate that also functions as the supporting component; electronic components for drive composed of the semiconductor device having the function as the peripheral drive circuit of the optical sensor, the resistors, the capacitors, etc. are provided on the lower surface of the circuit board; and wiring for connecting the optical sensor and the electronic components for drive is formed in the circuit board. Therefore, the thickness of the circuit board is hardly utilized effectively, consequently, the entire thickness of the optical sensor module becomes large.

It is therefore an object of the present invention to provide an optical sensor module whose thickness is thin.

SUMMARY OF THE INVENTION

The present invention comprises wiring for electrically connecting connection pads of an optical sensor with electrodes for connecting to an external device of a semiconductor device provided at least at one part on an insulation layer formed at and around the semiconductor device, therefore, a circuit board on which the semiconductor device and the optical sensor are mounted is not required, consequently, there is an advantage that the entire optical sensor module can be thin.

In order to obtain the above-mentioned advantage, the optical sensor module of the present invention comprises an optical sensor comprising a first semiconductor substrate, a photoelectric conversion device area provided on an upper surface of the first semiconductor substrate and a plurality of connection pads connected to the photoelectric conversion device area; a semiconductor structure comprising a second semiconductor substrate having an integrated circuit provided thereon and a plurality of electrodes for external connection formed on the second semiconductor substrate; an insulating layer formed on a periphery of the semiconductor structure; an insulating film formed on the insulating layer; and a first wiring connecting at least one of the electrodes of the semiconductor structure to one of the connection pads of the optical sensor.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 20 is a sectional view of a partially formed item initially prepared during manufacturing an optical sensor shown in FIG. 3;

FIG. 21 is a sectional view of a process subsequent to the process shown in FIG. 20;

FIG. 38 is a sectional view of an initial process during manufacturing a semiconductor device shown in FIG. 29;

FIG. 39 is a sectional view of a process subsequent to the process shown in FIG. 38;

DETAILED DESCRIPTION OF THE PREFERRED EMBODIMENTS

Figure 1:
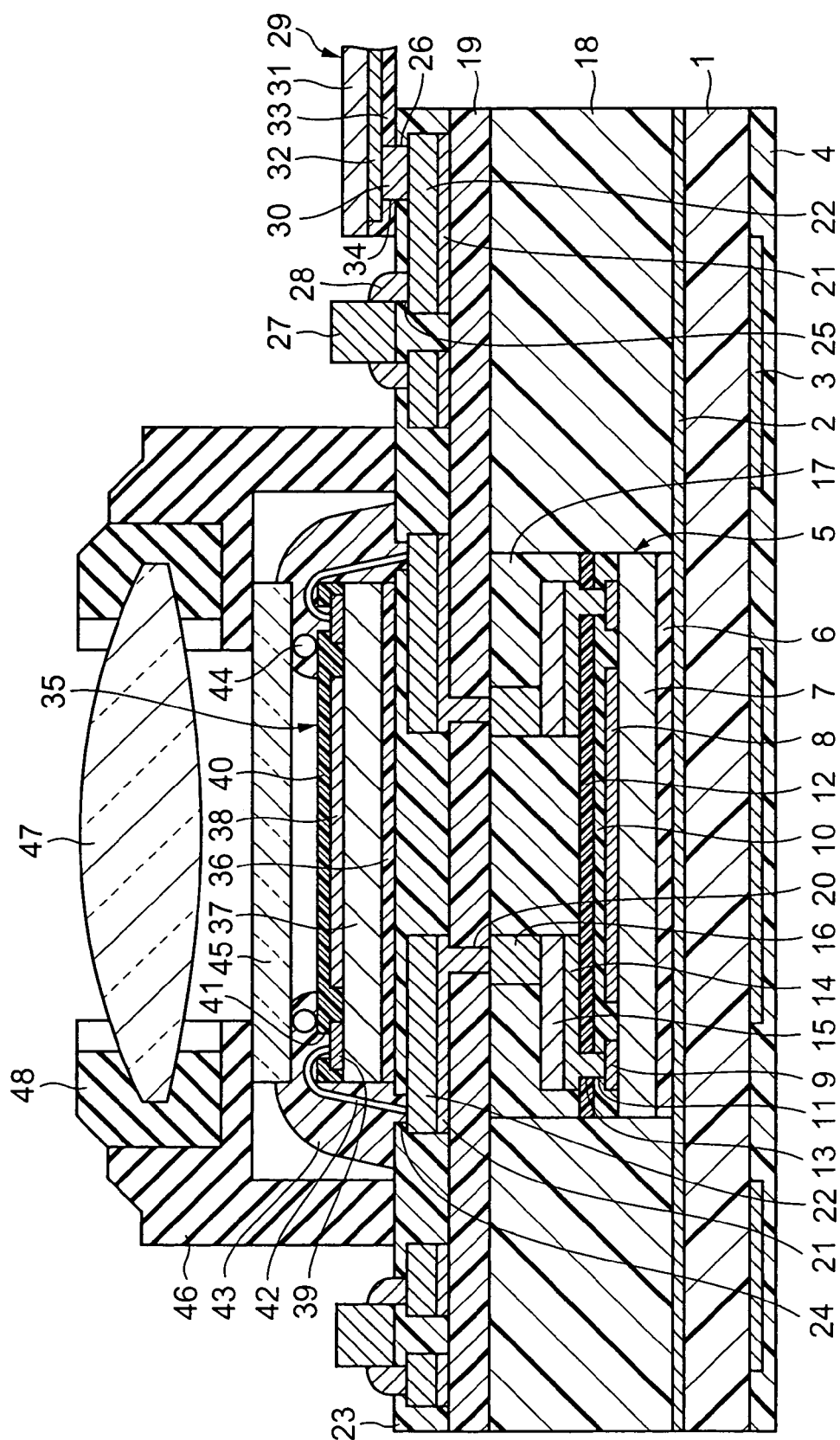
FIG. 1 is a sectional view of an optical sensor module according to a first embodiment of the present invention.

The optical sensor module according to the present invention is explained based on embodiments shown in the drawings.

First Embodiment

FIG. 1 is a sectional view of an optical sensor module according to a first embodiment of the present invention. This optical sensor module provides a base plate 1 of a rectangular shaped plane made of a glass cloth base epoxy resin, etc. Upper surface wiring 2 made of copper foil is formed on the upper surface of the base plate 1, and lower surface wiring 3 made of copper foil is formed on the lower surface thereof. In this case, the upper surface wiring 2 is a ground layer (noise shield layer) having a pattern covering the whole surface, and the lower surface wiring 3 is normal wiring. An overcoat film 4 made of such as solder resist is formed on the bottom surface of the base plate 1 including the lower surface wiring 3.

At a predetermined position on the upper surface of the upper surface wiring 2, the lower surface of a semiconductor structure 5 of a rectangular shaped plane having a size being smaller to a certain degree than the size of the base plate 1 is glued via an adhesive layer 6 made of a die bonding material. In this case, the semiconductor structure 5 has a function as a peripheral drive circuit of an optical sensor 35 mentioned later, and provides wiring 15, pillar-shaped electrodes 16 (electrodes for connecting to an external device), and a sealing film 17, mentioned later, and is generally called as a CSP (chip size package). Especially, as mentioned later, the following method is used, that is, after the wiring 15, the pillar-shaped electrodes 16, and the sealing film 17 were formed on a silicon wafer, each semiconductor structure 5 is obtained by dicing, therefore, in particular, this is called a wafer level CPS (W-CPS). Next, the configuration of the semiconductor structure 5 is explained.

The semiconductor structure 5 provides a silicon substrate (semiconductor substrate) 7. The lower surface of the silicon substrate 7 is glued on the upper surface of the base plate 1 via the adhesive layer 6. At the center part of the upper surface of the silicon substrate 7, an integrated circuit 8 having a predetermined function is provided, at the rim part of the upper surface of the silicon substrate 7, a plurality of connection pads 9 (electrodes for connecting to an external device) made of an aluminum type metal, etc. are provided by connecting to the integrated circuit 8. The upper surface of the silicon substrate 7 except the center part of the connection pads 9, an insulation film 10 made of silicon oxide, etc. is formed, and the center part of the connection pads 9 is exposed via an opening part 11 formed at the insulation film 10.

On the upper surface of the insulation film 10, a protection film 12 made of an epoxy type resin, a polyimide type resin, etc. is formed. In this case, an opening part 13 is formed in the protection film 12 at the part corresponding to the opening part 11 of the insulation film 10. On the upper surface of the protection film 12, a bedding metal layer 14 made of copper, etc. is formed. On the entire upper surface of the bedding metal layer 14, the wiring 15 made of copper is formed. One end part of the wiring 15 including the bedding metal layer 14 is connected to the connection pads 9 via the both of the opening parts 11 and 13.

On the upper surface of the connection pad part of the wiring 15, the pillar-shaped electrodes 16 (electrodes for connecting to an external device) are formed. On the upper surface of the protection film 12 including the wiring 15, the sealing film 17 made of an epoxy type resin, a polyimide type resin, etc. is formed, in a manner that the level of the upper surface of the sealing film 17 becomes the same level of the upper surface of the pillar-shaped electrodes 16. As mentioned above, the semiconductor structure 5 called the W-CSP has a configuration that includes the silicon substrate 7, the integrated circuit 8, the connection pads 9, and the insulation film 10, and further includes the protection film 12, the wiring 15, the pillar-shaped electrodes 16, and the sealing film 17.

On the upper surface of the upper surface wiring 2 around the semiconductor structure 5, an insulation layer 18 of a rectangular frame shape is formed in a manner that the level of the upper surface of the insulation layer 18 becomes almost the same level of the upper surface of the semiconductor structure 5. The insulation layer 18 is made of, for example, a thermosetting resin such as an epoxy type resin, a polyimide type resin, or a material which a reinforcement material made of silica filler, a glass fiber, etc. is mixed in such a thermosetting resin.

On the upper surfaces of the semiconductor structure 5 and the insulation layer 18, an insulation film 19 is formed in a manner that the upper surface of the insulation film 19 is made flat. The insulation film 19 is made of a material generally called a build up material using for a build up substrate, for example, a material which a reinforcement material made of silica filler, a glass fiber, etc. is mixed in a thermosetting resin such as an epoxy type resin, a BT (Bismaleimide Triazine) resin, etc.

An opening part 20 is formed in the insulation film 19 at the part corresponding to the center part of the upper surface of the pillar-shaped electrodes 16. On the upper surface of the insulation film 19, a bedding metal layer 21 made of copper, etc. is formed. On the entire upper surface of the bedding metal layer 21, wiring 22 composed of a copper layer and a gold layer formed on the upper surface of the copper layer is formed. The wiring 22 including the bedding metal layer 21 is connected to the upper surface of the pillar-shaped electrodes 16 via an opening part 20 of the insulation film 19.

On the upper surface of the insulation film 19 including the wiring 22, an overcoat film 23 made of solder resist, etc. is formed. At parts of the overcoat film 23, corresponding to a first and a second connection pad parts and external connection terminals of the wiring 22, a first to third opening parts 24 to 26 are formed. In addition, the gold layer of wiring 22 is formed only in the portion exposed to the first opening part 24 in an area that is later mentioned which carries out wiring bonding, while a copper layer may be formed outside this region.

On the upper surfaces of the overcoat film 23, between the second opening parts 25, which are one group as a pair, a chip component 27 composed of resistors, capacitors, etc. is situated. Electrodes at both sides of the chip component 27 are connected to the second connection pad part of the wiring 22 exposed via the second opening parts 25, which are one group as a pair, via the solder 28.

To an external connection terminal of the wiring 22 exposed via the third opening part 26, one end part of a flexible wiring plate 29 is glued by an anisotropic conductive adhesive 30. The flexible wiring plate 29 has a structure, in which wiring 32 is formed on the lower surface of a film base 31; an overcoat film 33 made of solder resist, etc. is formed on the lower surface of the film base 31 except both end parts of the wiring 32; and the both end parts of the wiring 32 are exposed via opening parts 34 (one of them is not shown) formed at the overcoat film 33. And one end part of the wiring 32 exposed via the opening part 34 of the flexible wiring plate 29 is connected to the external connection terminal of the wiring 22 exposed via the third opening part 26, via the anisotropic conductive adhesive 30.

On a predetermined position of the upper surface of the overcoat film 23, the lower surface of the optical sensor 35 of the rectangular shaped plane is glued via an adhesive layer 36 made of a die bonding material. The optical sensor 35 provides a silicon substrate (semiconductor substrate) 37. The lower surface of the silicon substrate 37 is glued on the upper surface of the overcoat film 23 via the adhesive layer 36. At the center part of the upper surface of the silicon substrate 37, a photoelectric conversion device area 38 including elements such as a CCD, a photodiode, and a phototransistor is formed, and at the rim part of the upper surface of the silicon substrate 37, a plurality of connection pads 39 made of an aluminum type metal, etc. are formed and connected to the photoelectric conversion device area 38 by wiring for connection (not shown).

On the upper surface of the silicon substrate 37 except the center part of the connection pads 39, an insulation film 40 made of silicon oxide, etc. is formed, and the center part of the connection pads 39 is exposed via an opening part 41 formed in the insulation film 40. And the connection pads 39 of the optical sensor 35, via a bonding wire 42 made of gold, are connected to the first connection pad part of the wiring 22 exposed via the first opening part 24 of the overcoat film 23.

At a part around the optical sensor 35 and at a predetermined position of the upper surface of the overcoat film 23 including the bonding wire 42, a sealing material 43 made of an epoxy type resin, a polyimide type resin, etc. is formed. In this case, a glass plate 45 for cutting ultraviolet rays situated on the upper surface of the optical sensor 35 via a spacer 44 is glued at the upper surface side of the sealing material 43. The glass plate 45 has a function as a sealing material for protecting the photoelectric conversion device area 38 of the optical sensor 35, in addition to the function for cutting ultraviolet rays.

A lens holder 46 is situated at the outside of the glass plate 45 and the sealing material 43. To the lens holder 46, a holding cylinder 48 for holding the lens 47 situated above the glass plate 45 is attached in a manner that the holding cylinder 48 can rotate. In this, the chip component 27 is situated on the upper surface of the overcoat film 23 around the lens holder 46 including the optical sensor 35.

As mentioned above, in this optical sensor module, the insulation layer 18 is formed on the upper surface of the base plate 1 around the semiconductor structure 5 having the function as the peripheral drive circuit of the optical sensor 35, the wiring 22 is formed on the semiconductor structure 5 and the insulation layer 18, and the optical sensor 35 is situated on the overcoat film 23 covering the wiring 22. Therefore, it is not necessary to provide a circuit board on which the semiconductor structure 5 and the optical sensor 35 are mounted, consequently, the entire optical sensor module can be made thin. Further, the chip component 27 is situated on the upper surface of the overcoat film 23 around the lens holder 46 including the optical sensor 35, therefore, even if the chip component 27 is provided, it is possible that the entire module does not become thick. Here, although not meaning to limit the embodiment, the thickness (height) of each film, material, and component is illustrated. The thickness of the silicon substrate 7 is 0.2 to 0.4 mm, the height of the pillar-shaped electrodes 16 are 0.05 to 0.15 mm, the thickness of the semiconductor structure 5 is 0.25 to 0.55 mm, the thickness of each of the base plate 1, the insulation film 19, and the overcoat film 23 is 0.05 to 0.1 mm, and the thickness from the lower surface of the overcoat film 4 of the lowest surface to the upper surface of the overcoat film 23 of the highest surface, that is, the entire thickness of a drive semiconductor package except the optical sensor 35 is 0.6 to 0.8 mm. In other words, the thickness of the optical sensor module except mechanical components such as the lens 47, the holding cylinder 48, the lens holder 46, etc. can be 1 mm or less.

Second Embodiment

Figure 2:
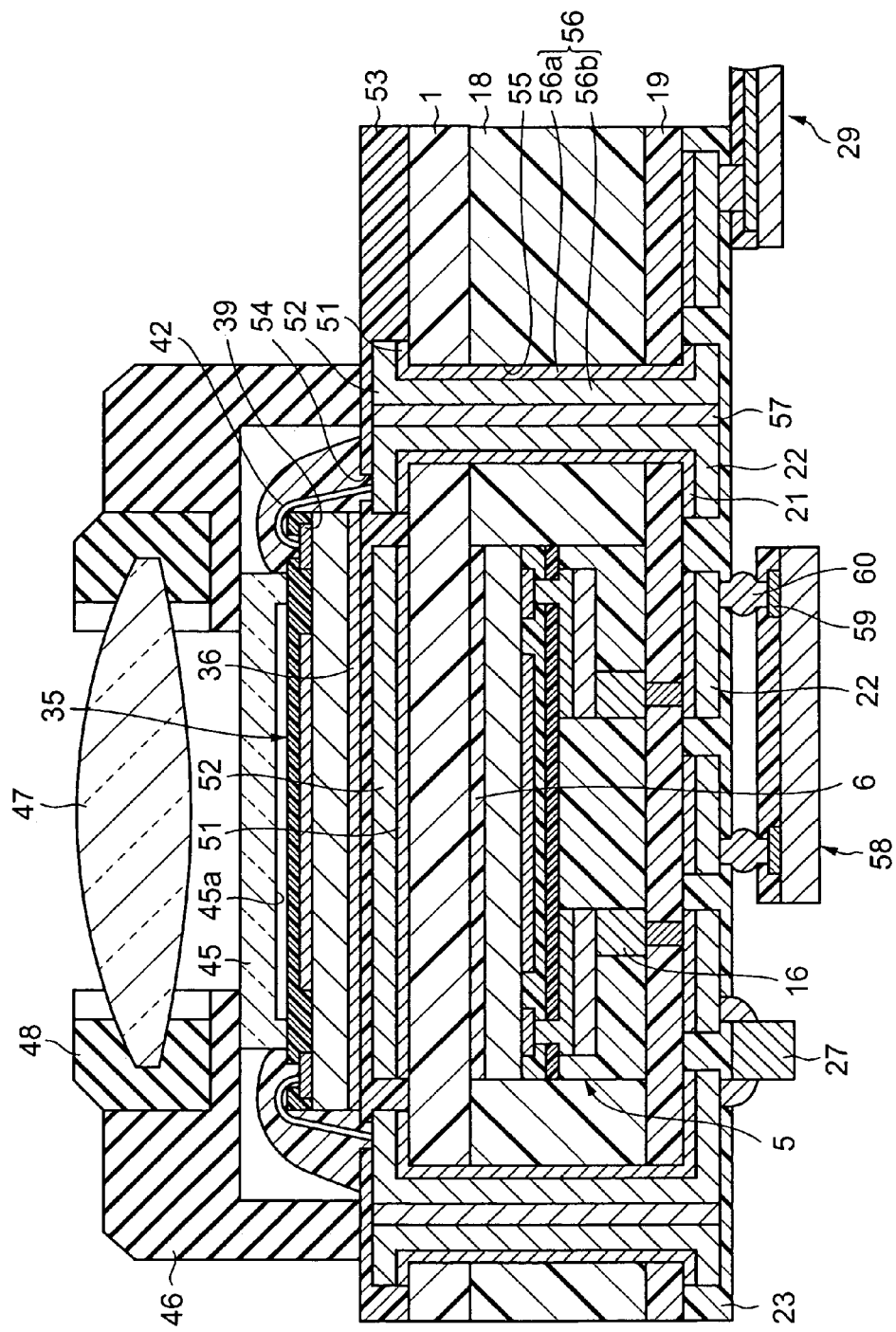
FIG. 2 is a sectional view of an optical sensor module according to a second embodiment of the present invention.

FIG. 2 is a sectional view of an optical sensor module according to a second embodiment of the present invention. At this optical sensor module, the points being largely different from the case shown in FIG. 1 are as follows. The parts, except the optical sensor 35 and the lens holder 46, that is, the base plate 1, the semiconductor structure 5, and the insulation layer 18 are situated inverted, further, a vertical conduction part 56, for electrically connecting, the pillar-shaped electrodes 16 of the semiconductor structure 5 facing the opposite surface side of the surface side at which the optical sensor 35 is situated, with the connection pads 39 of the optical sensor 35, is provided. And the upper surface wiring 2 and the lower surface wiring 3 and the spacer 44 are not provided.

In FIG. 2, on the lower surface of the base plate 1, the semiconductor structure 5 is glued via the adhesive layer 6. On the lower surface of the base plate 1 around the semiconductor structure 5, the insulation layer 18 is formed. On the lower surface of the semiconductor structure 5 and the insulation layer 18, the wiring 22 including the bedding metal layer 21 is formed via the insulation film 19. On the lower surface of the overcoat film 23, the chip component 27 and the flexible wiring plate 29 are formed.

On the upper surface of the base plate 1, a bedding metal layer 51 made of copper, etc. is formed. On the entire upper surface of the bedding metal layer 51, wiring 52 made of copper is formed. In this case, the wiring 52 including the bedding metal layer 51 formed on the upper surface of the base plate 1 on the semiconductor structure 5 is a ground layer (noise shield layer) having a pattern covering the whole surface.

On the upper surface of the base plate 1 including the wiring 52, an overcoat film 53 made of solder resist, etc. is formed. An opening part 54 is formed in the overcoat film 53 at a part corresponding to the connection pads of the wiring 52. And the connection pads 39 of the optical sensor 35, via the bonding wire 42, are connected to the connection pad part of the wiring 52 exposed via the opening part 54 of the overcoat film 53.

A part of the wiring 52 including the bedding metal layer 51 and a part of the wiring 22 including the bedding metal layer 21 are connected via the vertical conduction part 56 composed of, a bedding metal layer 56a made of copper, etc. situated on the inside wall surface of a through hole 55 formed at a predetermined position of the insulation layer 18 and the insulation film 19, and a copper layer 56b. In this case, in the vertical conduction part 56, in order to improve electric conduction of the vertical wiring, a conductive material 57 made of such as a copper paste, a silver paste, and a conductive resin may be filled in; however, it may be filled with an insulating resin or it may be hollow.

At a part of the glass plate 45 except the rim part of the lower surface, a concave part 45a is formed by, for example, a processing method such as counter boring. And the rim part of the lower surface of the glass plate 45 is positioned on the upper surface of the optical sensor 35. And on the lower surface of the overcoat film 23, in addition to the chip component 27, a semiconductor chip 58 being a bare chip is situated. The connection pads 59 of the semiconductor chip 58 are connected to the connection pad part of the wiring 22 via a solder ball 60. The bare chip is, a semiconductor chip in a state, obtained by dicing a wafer in which integrated semiconductor circuits are formed, or a semiconductor chip in which a protection film is formed around integrated circuits of such semiconductor device and signifies what does not have a lead frame.

Third Embodiment

Figure 3:
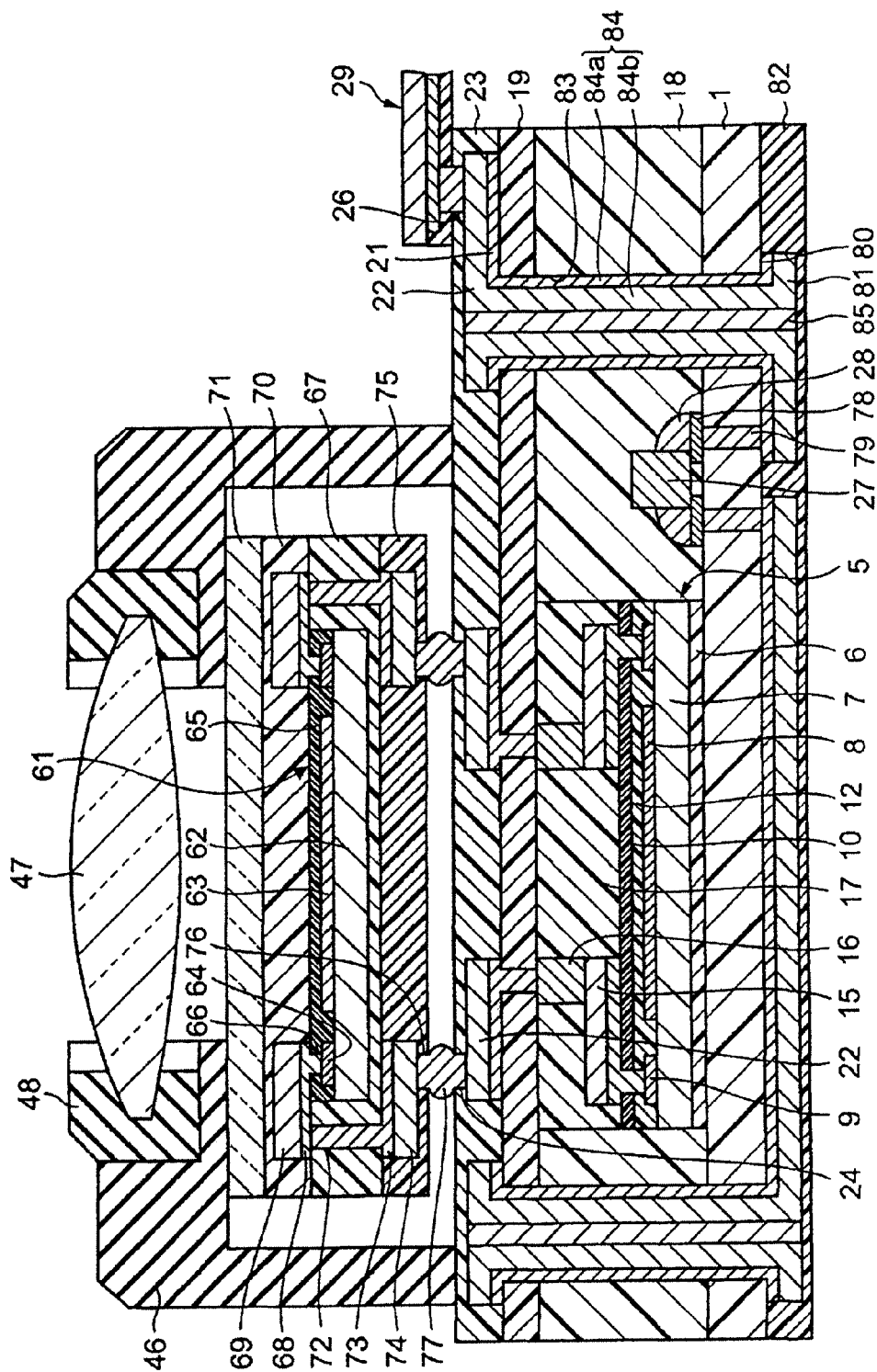
FIG. 3 is a sectional view of an optical sensor module according to a third embodiment of the present invention.

FIG. 3 is a sectional view of an optical sensor module according to a third embodiment of the present invention. As this optical sensor module, the points being largely different from the case shown in FIG. 1 are as follows. An optical sensor 61, having a structure mentioned later, is connected to the connection pad part of the wiring 22 via a solder ball 77, the chip component 27 is situated on the base plate 1 and embedded in the insulation layer 18, and a vertical conduction part 84 for electrically connecting the chip component 27 with the wiring 22 is provided. In this case, the upper surface wiring 2 and the lower surface wiring 3 shown in FIG. 1 are not provided. In case of this embodiment, the optical sensor 61 is connected by the solder ball 77, therefore, it is not necessary that a gold layer is formed on the wiring 22, only the copper layer is enough for the whole surface.

Next, the structure of the optical sensor 61 is explained. The optical sensor 61 provides a silicon substrate (semiconductor substrate) 62. At the center part of the upper surface of the silicon substrate 62, a photoelectric conversion device area 63 including elements such as a CCD, a photodiode, a phototransistor is provided, and at the rim part of the upper surface of the silicon substrate 62, a plurality of connection pads 64 made of an aluminum type metal, etc. are provided by connecting to the photoelectric conversion device area 63.

On the upper surface of the silicon substrate 62 except the center part of the connection pads 64, an insulation film 65 made of silicon oxide, etc. is formed, and the center part of the connection pads 64 are exposed via an opening part 66 formed in the insulation film 65. On the lower surface and around the lower surface of the silicon substrate 62, an insulation layer 67 made of an epoxy type resin, a polyimide type resin, etc is formed. In this case, the level of the upper surface of the insulation layer 67 formed around the silicon substrate 62 is almost the same level of the upper surface of the insulation film 65 formed on the upper surface of the silicon substrate 62.

On the upper surfaces of the insulation film 65 and insulation layer 67, a bedding metal layer 68 made of copper, etc. is formed. On the entire upper surface of the bedding metal layer 68, upper surface wiring 69 made of copper is formed. One end part of the upper surface wiring 69 including the bedding metal layer 68 is connected to the connection pads 64 via an opening part 66 of the insulation film 65. On the upper surfaces of the insulation film 65 and insulation layer 67 including the upper surface wiring 69, a glass plate 71 for cutting ultraviolet rays is situated via a transparent adhesive layer 70 made of a transparent epoxy type resin, etc.

An opening part 72 is formed in the insulation layer 67 at a part corresponding to the connection pad part of the upper surface wiring 69. On the lower surface of the insulation layer 67, a bedding metal layer 73 made of copper, etc is provided. On the entire lower surface of the bedding metal layer 73, lower surface wiring 74 made of copper is formed. The bedding metal layer 73 and the lower surface wiring 74 become a penetrating electrode penetrating in the thickness direction of the insulation layer 67, and are electrically connected to the lower surface wiring 74 and the upper wiring 69 via this penetrating electrode. On the lower surface of the insulation layer 67 including the lower surface wiring 74, an overcoat film 75 made of solder resist, etc. is formed.

An opening part 76 is formed in the overcoat film 75 at a part corresponding to the connection pad part of the lower surface wiring 74. In and under the opening part 76, a solder ball 77 is formed by connecting to the connection pad part of the lower surface wiring 74. And the optical sensor 61 is mounted on the overcoat film 23, by that the solder ball 77 is connected to the connection pad part of the wiring 22 exposed via the opening part 24 of the overcoat film 23.

Next, the chip component 27 and the like are explained. At a predetermined position of the upper surface of the base plate 1, a pair of connection terminals 78 made of copper foil is formed. Inside a through hole formed in the base plate 1 under the pair of the connection terminals 78, a vertical conduction part 79 made of a copper paste, a silver paste, a conductive resin, etc. is formed by connecting to the connection terminals 78. To the upper surface of the pair of connection terminals 78, electrodes at both sides of the chip component 27 are connected via the solder 28. And the chip component 27 including the solder 28 is embedded in the insulation layer 18.

On the lower surface of the base plate 1, a bedding metal layer 80 made of copper, etc. is formed. On the entire lower surface of the bedding metal layer 80, wiring 81 made of copper is formed. One end part of the wiring 81 including the bedding metal layer 80 is connected to the vertical conduction part 79. On the entire lower surface of the base plate 1 including the wiring 81, an overcoat film 82 made of solder resist, etc. is formed.

The wiring 81 including the bedding metal layer 80 and a part of the wiring 22 including the bedding metal layer 21 are connected via a vertical conduction part 84 composed of, a bedding metal layer 84a made of copper, etc. situated on the inside wall surface of a through hole 83 formed at a predetermined position of the base plate 1, the insulation layer 18, and the insulation film 19; and a copper layer 84b. In this case, also, in the vertical conduction part 84, in order to make electric conductivity of the vertical wiring excellent, a conductive material 85 made of such as a copper paste, a silver paste, and a conductive resin is filled, however, it may be good to fill an insulation resin, or it may be right to be vacant.

And according to this optical sensor module, the part except the vertical conduction part 84 in the insulation layer 18 formed on the base plate 1 around the semiconductor structure 5 is a dead space, therefore, when the chip component 27 is situated in this dead space on the base plate 1, the space can be used effectively.

Fourth Embodiment

Figure 4:
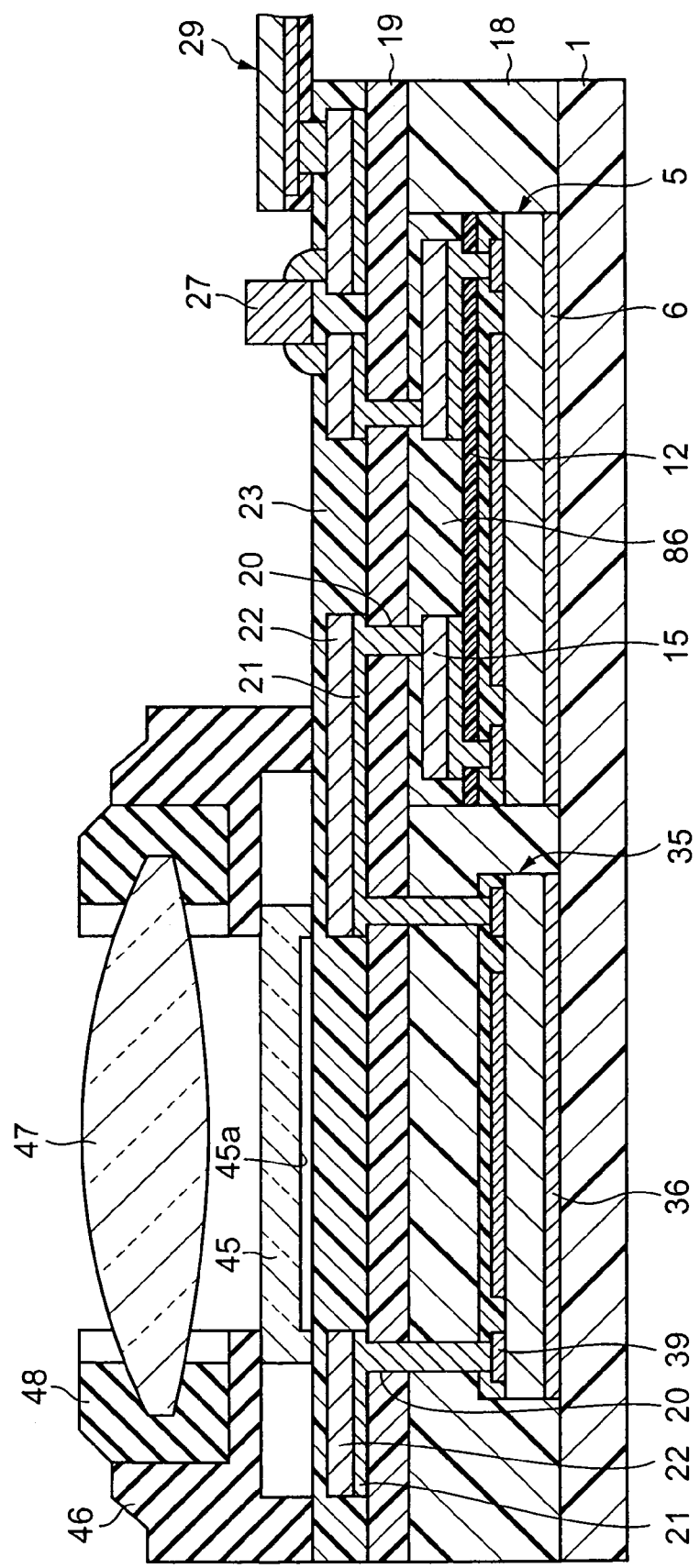
FIG. 4 is a sectional view of an optical sensor module according to a fourth embodiment of the present invention.

FIG. 4 is a sectional view of an optical sensor module according to a fourth embodiment of the present invention. At this optical sensor module, the points being largely different from the case shown in FIG. 1 are as follows. That is, the semiconductor structure 5 and the optical sensor 35 are not laminated, but are juxtaposed in a plane state on base plate 1. In this case, the upper surface wiring 2, the lower surface wiring 3, and the overcoat film 4 shown in FIG. 1 are not formed.

That is, at a predetermined position on the upper surface of the base plate 1, the semiconductor structure 5 is glued via the adhesive layer 6, and at other predetermined positions on the upper surface of the base plate 1, the optical sensor 35 is glued via the adhesive layer 36. In this case, the semiconductor structure 5 has a structure in which the pillar-shaped electrodes 16 and the sealing film 17 shown in FIG. 1 are not provided, and an overcoat film 86 is formed on the upper surface of the protection film 12 including the wiring 15.

And the wiring 22 including the bedding metal layer 21 is connected to the connection pad part of the wiring 15 of the semiconductor structure 5 and the connection pads 39 of the optical sensor 35 via the opening part 20 formed in the insulation film 19, etc. In this, the insulation layer 18, the insulation film 19, and the overcoat film 23 are made of a transparent epoxy type resin, etc. And at a part of the glass plate 45 except the rim part of the lower surface, the concave part 45a is formed by, for example, a processing method such as counter boring. And the rim part of the lower surface of the glass plate 45 is situated on the upper surface of the overcoat film 23. In this, the semiconductor structure 5 shown in the fourth embodiment can be applied to the optical sensor module shown in each of the first to third embodiments.

Figure 5:
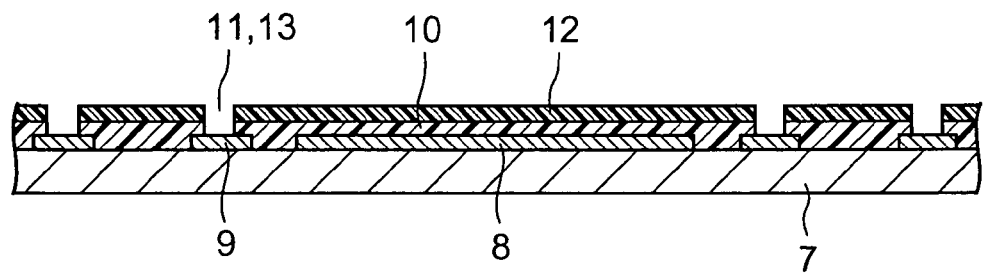
FIG. 5 is a sectional view of a partially formed item initially prepared during manufacturing a part including a semiconductor device shown in FIG. 3.

Next, as representation, an example of a manufacturing method of a part of the optical sensor module shown in FIG. 3 is explained. First, an example of a manufacturing method of the semiconductor structure 5 is explained. In this case, first, as shown in FIG. 5, a partially formed item, in which an integrated circuit 8, a connection pads 9 made of an aluminum type metal, etc., an insulation film 10 made of silicon oxide, etc., a protection film 12 made of an epoxy type resin, a polyimide type resin, etc., are formed on a silicon substrate (semiconductor substrate) 7 of a wafer state; and the center part of the connection pad 9 is exposed via opening parts 11 and 13 formed in the insulation film 10 and the protection film 12, is prepared.

Figure 6:
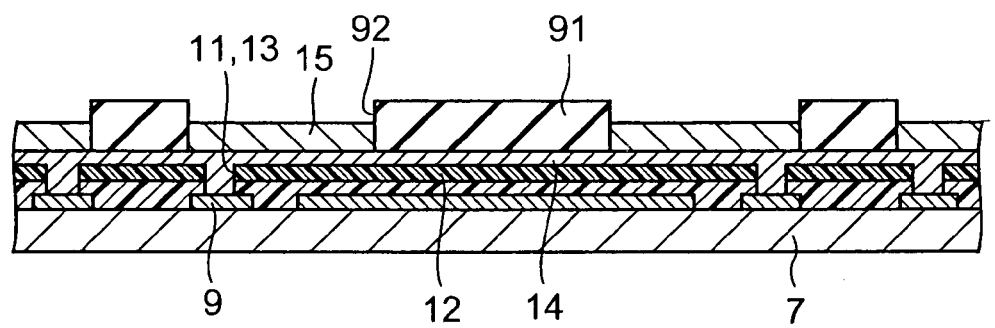
FIG. 6 is a sectional view of a process subsequent to the process shown in FIG. 5.

Next, as shown in FIG. 6, on the entire upper surface of the protection film 12 including the upper surface of the connection pad 9 exposed via both of the opening parts 11 and 13, a bedding metal layer 14 is formed. In this case, the bedding metal layer 14 can be made of only a copper layer formed by electroless plating, of only a copper layer formed by sputtering, or of a material in which a copper layer is formed by sputtering on a thin film layer of titanium, etc. formed by sputtering.

Next, on the upper surface of the bedding metal layer 14, a plating resist film 91 is formed by patterning. In this case, an opening part 92 is formed in the plating resist film 91 at a part corresponding to a region forming wiring 15. Next, by executing copper electro plating by using the bedding metal layer 14 as a plating current route, the wiring 15 is formed on the upper surface of the bedding metal layer 14 in the opening part 13 of the plating resist film 91. Next, the plating resist film 91 is removed.

Figure 7:
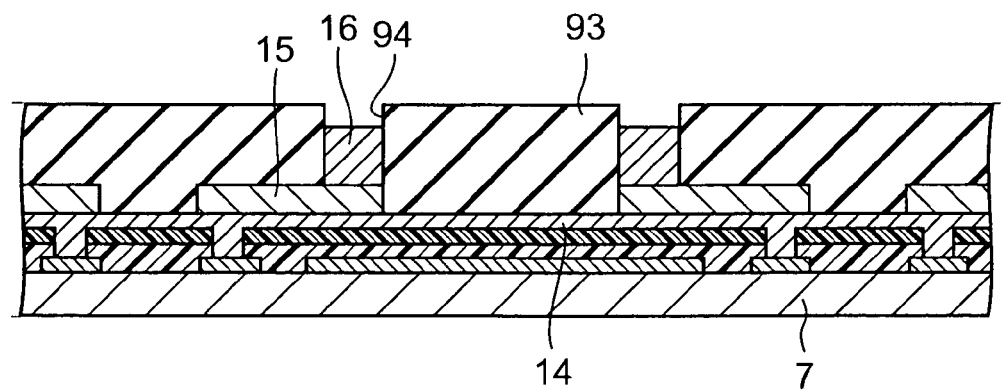
FIG. 7 is a sectional view of a process subsequent to the process shown in FIG. 6.
Figure 8:
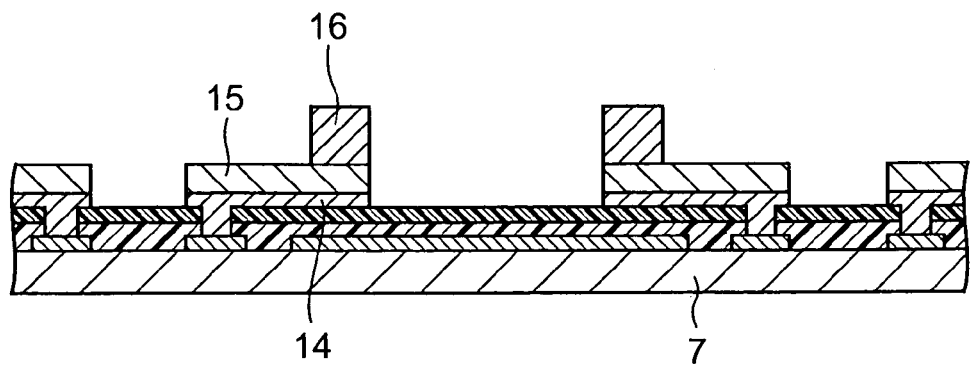
FIG. 8 is a sectional view of a process subsequent to the process shown in FIG. 7.

Next, as shown in FIG. 7, a plating resist film 93 is formed on the upper surface of the bedding metal layer 14 including the wiring 15 by patterning. In this case, an opening part 94 is formed in the plating resist film 93 at a part corresponding to a region forming pillar-shaped electrodes 16. Next, by executing copper electro plating by using the bedding metal layer 14 as a plating current route, the pillar-shaped electrodes 16 are formed on the upper surface of the connection pad part of the wiring 15 in the opening part 94 in the plating resist film 93. Next, the plating resist film 93 is removed, and when unnecessary parts of the bedding metal layer 14 were removed by etching by using the wiring 15 as a mask, as shown in FIG. 8, the bedding metal layer 14 remains only under the wiring 15.

Figure 9:
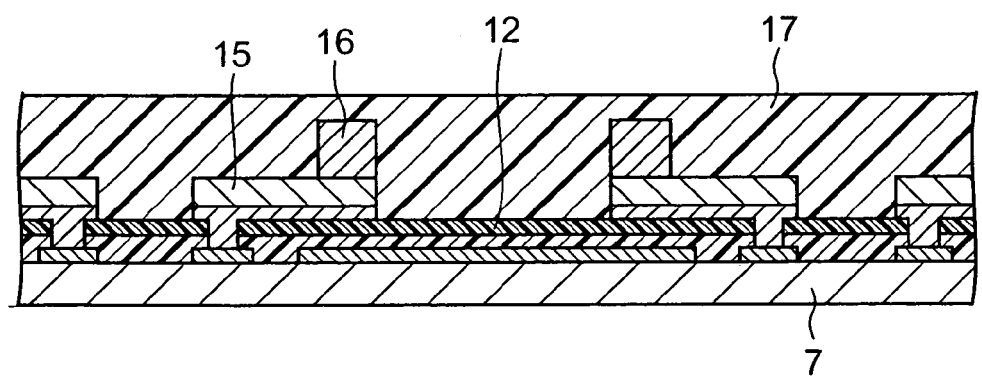
FIG. 9 is a sectional view of a process subsequent to the process shown in FIG. 8.

Next, as shown in FIG. 9, by a screen printing method, a spin coating method, a die coating method, etc., a sealing film 17, whose thickness is thicker than the height of the pillar-shaped electrodes 16, made of an epoxy type resin, a polyimide type resin, etc. is formed on the entire upper surface of the protection film 12 including the pillar-shaped electrodes 16 and the wiring 15. Therefore, in this state, the upper surface of the pillar-shaped electrodes 16 are covered with the sealing film 17.

Figure 10:
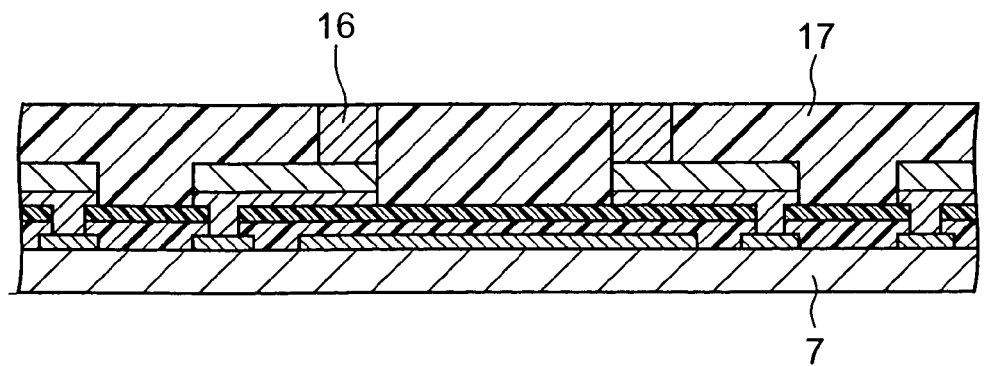
FIG. 10 is a sectional view of a process subsequent to the process shown in FIG. 9.

Next, the upper surface sides of the sealing film 17 and the pillar-shaped electrodes 16 are properly polished, and as shown in FIG. 10, the upper surface of the pillar-shaped electrodes 16 are exposed, and the upper surface of the sealing film 17 including the upper surface of these exposed pillar-shaped electrodes 16 are flattened. In this, the reason why the upper surface side of the pillar-shaped electrodes 16 are polished is because there is dispersion in the height of the pillar-shaped electrodes 16 formed by electro plating to get rid of this dispersion and to make the height of the pillar-shaped electrodes 16 uniform.

Figure 11:
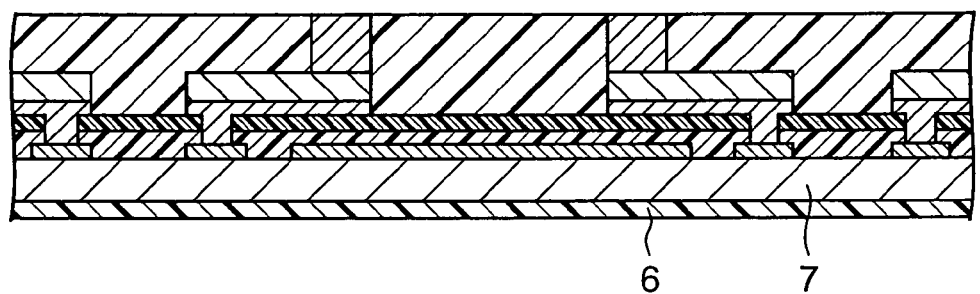
FIG. 11 is a sectional view of a process subsequent to the process shown in FIG. 10.
Figure 12:
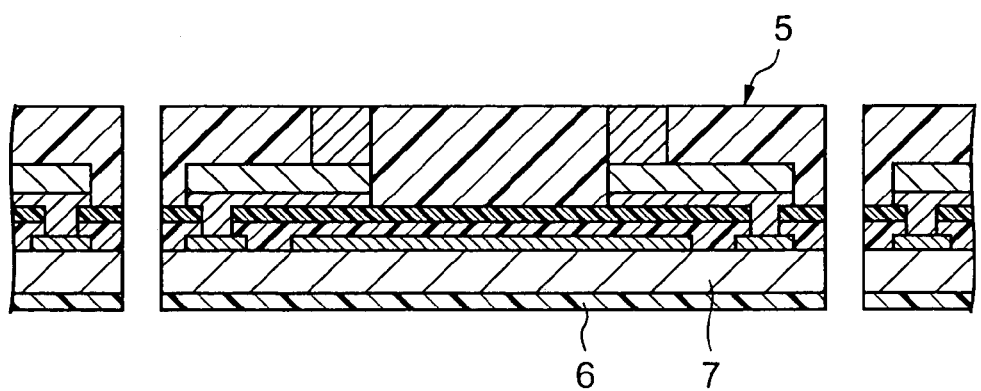
FIG. 12 is a sectional view of a process subsequent to the process shown in FIG. 11.

Next, as shown in FIG. 11, an adhesive layer 6 is glued on the entire lower surface of the silicon substrate 7. The adhesive layer 6 is made of a die bonding material such as an epoxy type resin and a polyimide type resin, and is glued on the silicon substrate 7 in a half hard state by applying heat and pressure. Next, the adhesive layer 6 glued on the silicon substrate 7 is attached on dicing tape (not shown), and after a dicing process shown in FIG. 12, when the dicing tape is removed, as shown in FIG. 3, a plurality of the semiconductor devices 5 having the adhesive layer 6 on the lower surface of the silicon substrate 7 are acquired.

Figure 13:
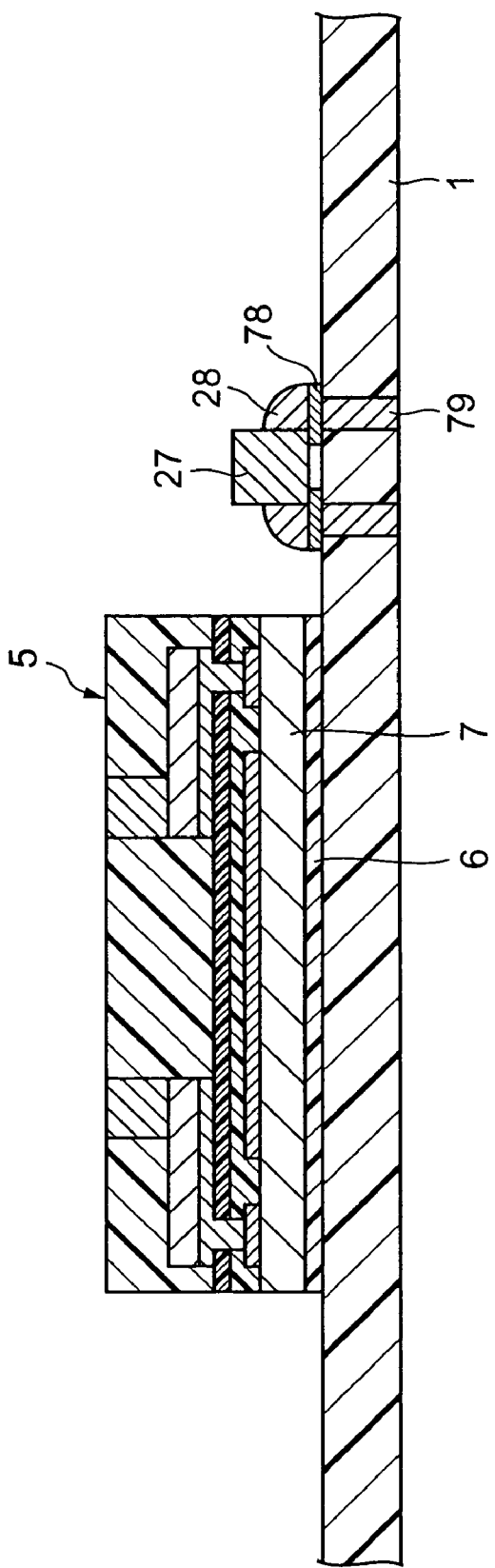
FIG. 13 is a sectional view of a process subsequent to the process shown in FIG. 12.

Next, by using the semiconductor structure 5 obtained by the processes mentioned above, an example of a manufacturing method of a part including the semiconductor structure 5 shown in FIG. 3 is explained. First, as shown in FIG. 13, a base plate whose plane shape is rectangular and has a size in which a plurality of base plates 1 can be obtained, is prepared, this does not limit the base plate.

In this case, at a predetermined position of the upper surface of the base plate 1, a pair of connection terminals 78 made of copper foil is formed, and in through holes formed in the base plate 1 under the pair of connection terminals 78, a vertical conduction part 79 made of a copper paste, a silver paste, a conductive resin, etc. is formed by connecting to the connection terminal 78.

Next, at a plurality of predetermined positions of the upper surface of the base plate 1, the adhesive layer 6 glued on the lower surface of the silicon substrate 7 of each of the semiconductor devices 5 is attached. At this adhesion, the adhesive layer 6 is normally hardened by applying heat and pressure. Next, on the upper surfaces of the pair of connection terminals 78, electrodes of both sides of a chip component 27 composed of capacitors, resistors, etc. are connected via solder 28, by this, the chip component 27 is situated at a predetermined position of the upper surface of the base plate 1. In this, it is possible that the semiconductor structure 5 is situated after disposing the chip component 27.

Figure 14:
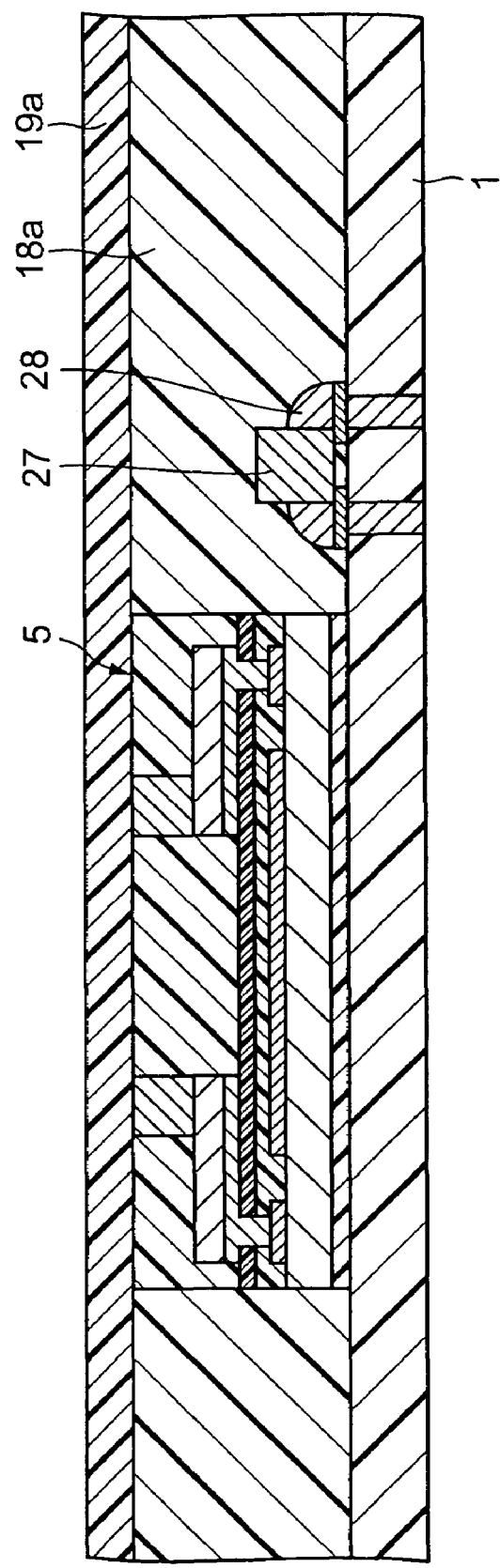
FIG. 14 is a sectional view of a process subsequent to the process shown in FIG. 13.

Next, as shown in FIG. 14, on the upper surface of the base plate 1 including the chip component 27 and the solder 28 around the semiconductor structure 5, a layer for forming insulation layer 18a is formed by a screen printing method, a spin coating method, etc. The layer for forming insulation layer 18a is made of, for example, a thermosetting resin such as an epoxy type resin, and a polyimide type resin, or a material in which a reinforcement material made of silica filler, a glass fiber, etc. is mixed in such a thermosetting resin.

Next, on the upper surfaces of the semiconductor structure 5 and the layer for forming insulation layer 18a, a sheet for forming insulation film 19a is situated. The sheet for forming insulation film 19a is preferably made of a build up material of a sheet shape, as this build up material, there is a material in which a thermosetting resin is made a half hard state by mixing silica filler in a thermosetting resin such as an epoxy resin. The material for the sheet for forming insulation film 19a is not limited to this.

In this, as the sheet for forming insulation film 19a, a prepreg material in which a thermosetting resin such as an epoxy type resin is impregnated in a glass cloth and the thermosetting resin is made a sheet shape by making it a half hard state, or a sheet material made of only a thermosetting resin in a half hard state in which silica filler is not mixed, can be used.

Figure 15:
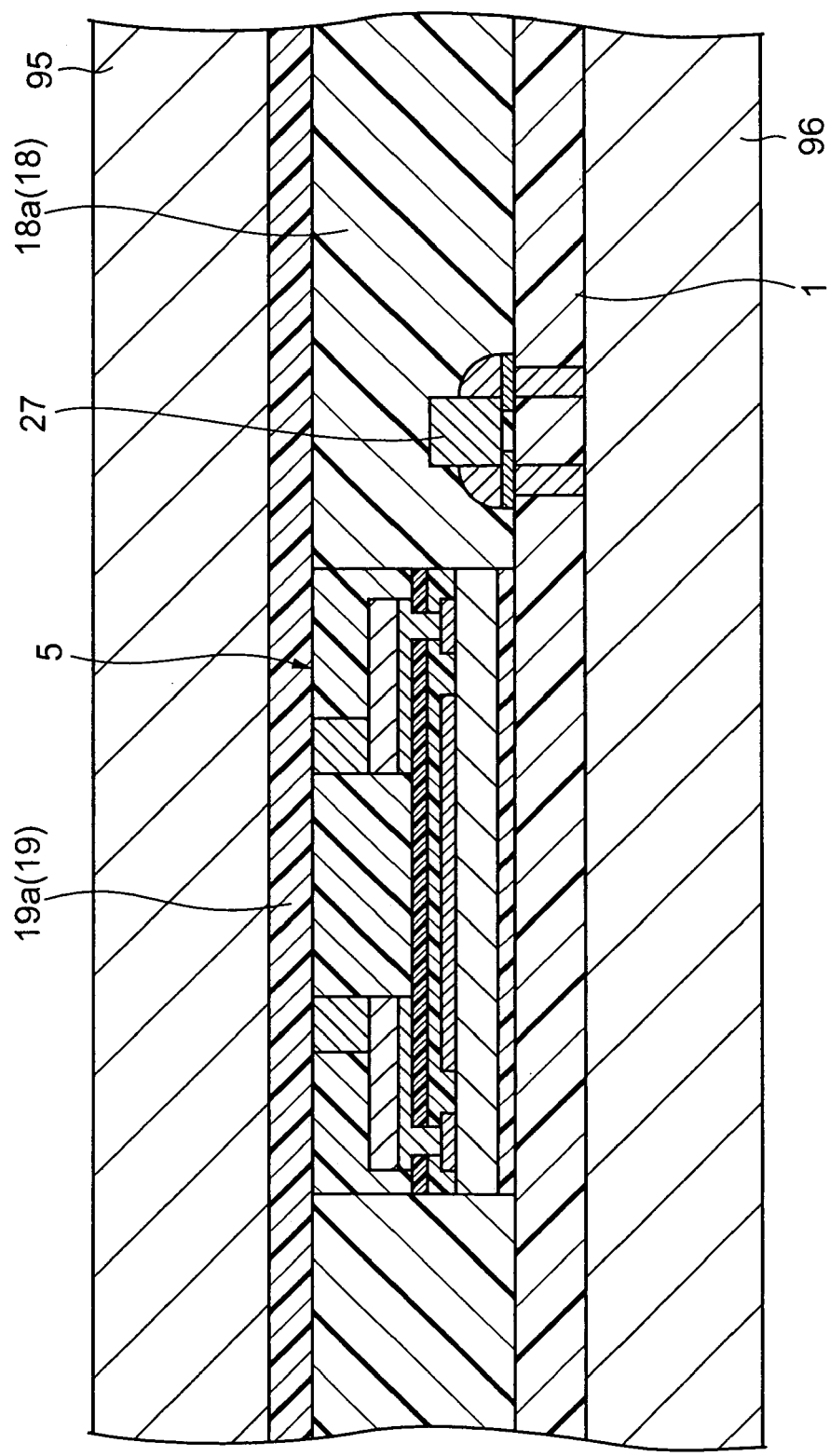
FIG. 15 is a sectional view of a process subsequent to the process shown in FIG. 14.

Next, as shown in FIG. 15, by using a pair of heat and pressure applying plates 95 and 96, the layer for forming insulation layer 18a and the sheet for forming insulation film 19a are heated and pressed from up and down. Then, on the upper surface of the base plate 1 including the chip component 27 and the solder 28 around the semiconductor structure 5, an insulation layer 18 is formed, and on the upper surface of the semiconductor structure 5 and the insulation layer 18, an insulation film 19 is formed. In this case, the upper surface of the insulation film 19 becomes a flat surface because the upper surface of the insulation film 19 is pushed by the lower surface of the heat and pressure applying plate 95. Therefore, a polishing process for flattening the upper surface of the insulation film 19 is not needed.

Figure 16:
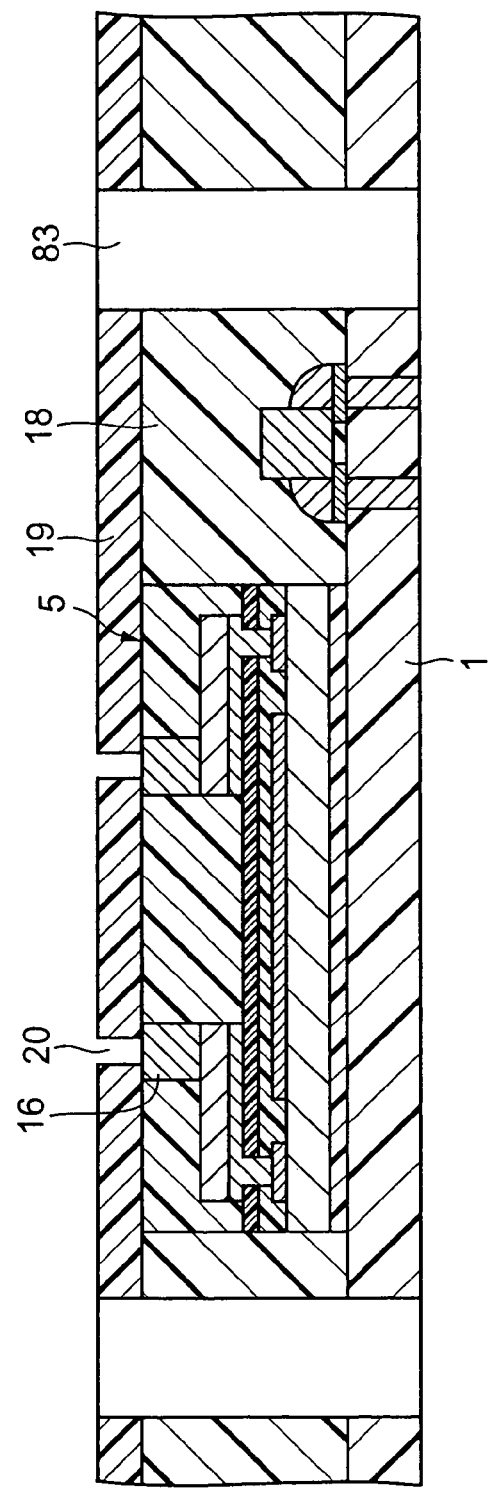
FIG. 16 is a sectional view of a process subsequent to the process shown in FIG. 15.

Next, as shown in FIG. 16, by using a laser process radiating laser beams, an opening part 20 is formed in the insulation film 19 at a part corresponding to the center part of the upper surface of pillar-shaped electrodes 16. And a through hole 83 is formed at a predetermined position of the insulation film 19, the insulation layer 18 and the base plate 1 by using a mechanical drill. Next, corresponding to the necessity, epoxy smears, etc. generated in the opening part 20, the through hole 83, etc. are removed by a de-smearing process.

Figure 17:
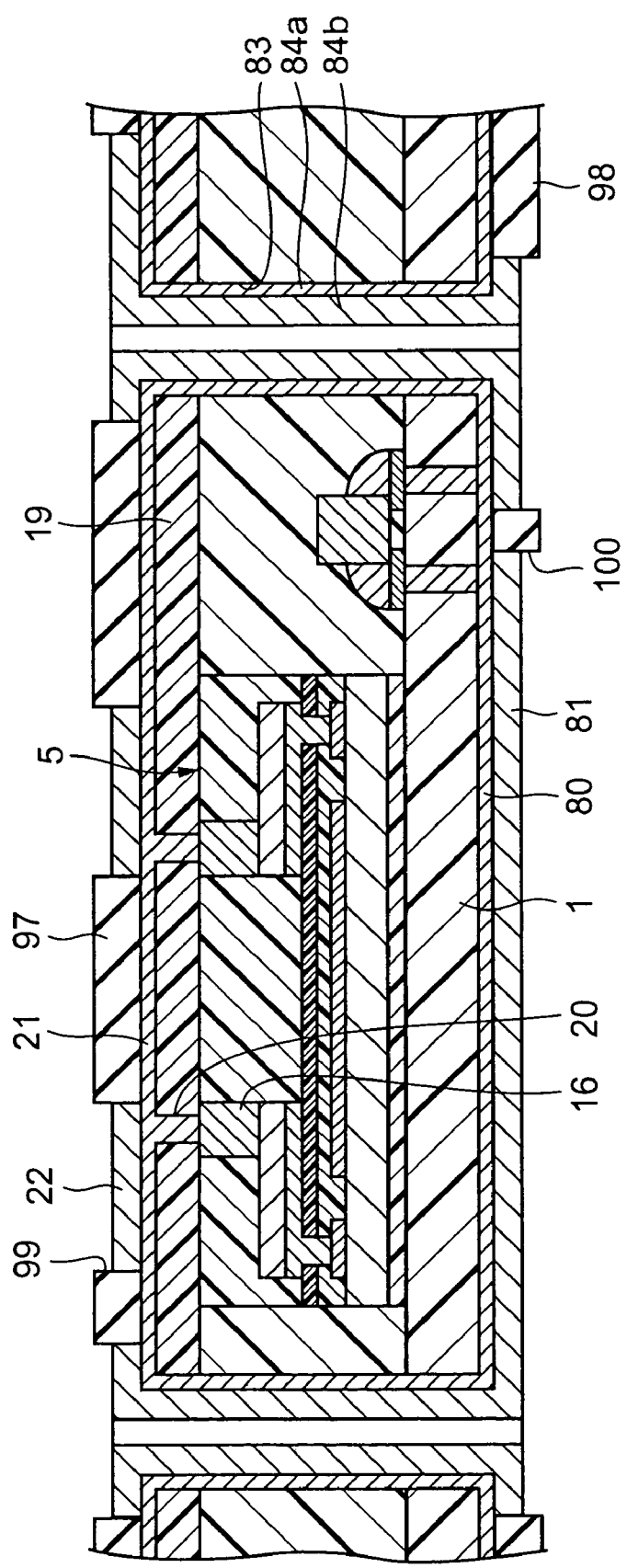
FIG. 17 is a sectional view of a process subsequent to the process shown in FIG. 16.

Next, as shown in FIG. 17, on the entire upper surface of the insulation film 19 including the upper surface of the pillar-shaped electrodes 16 exposed via the opening part 20, on the entire lower surface of the base plate 1 including the lower surface of the vertical conduction part 84, and on the inside wall surface of the through hole 83, bedding metal layers 21, 80, and 84a are formed by copper electroless plating. Next, on the upper surface of the bedding metal layer 21, a plating resist film 97 is formed by patterning, and on the lower surface of the bedding metal layer 80, a plating resist film 98 is formed by patterning. In this case, an opening part 99 is formed in the plating resist film 97 at a part corresponding to the region forming the wiring 22. And an opening part 100 is formed in the plating resist film 98 at a part corresponding to the region forming the wiring 81.

Next, by executing copper electroplating by using the bedding metal layers 21, 80 and 84a as plating current routes, the wiring 22 is formed on the upper surface of the bedding metal layer 21 in the opening part 99 of the plating resist film 97, and the wiring 81 is formed on the lower surface of the bedding metal layer 80 in the opening part 100 of the plating resist film 98, further, a copper layer 84b is formed on the surface of the bedding metal layer 84a in the through hole 83.

Figure 18:
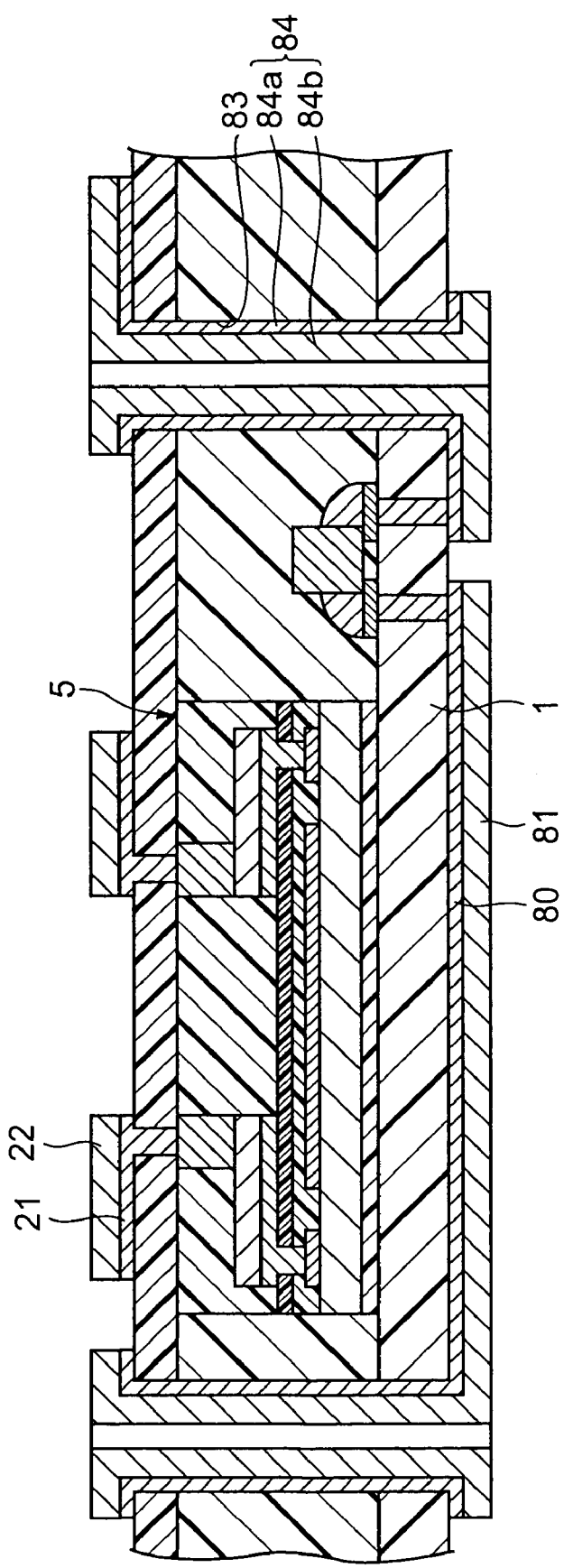
FIG. 18 is a sectional view of a process subsequent to the process shown in FIG. 17.

Next, both the plating resist films 97 and 98 are removed, and when unnecessary parts of the bedding metal layers 21 and 80 were removed by etching by using the wiring 22 and 81 as a mask, as shown in FIG. 18, the bedding metal layer 21 remains only under the wiring 22, and the bedding metal layer 80 remains only on the wiring 81. And at this state, the vertical conduction part 84 composed of the bedding metal layer 84a and the copper layer 84b are formed in the through hole 83.

Figure 19:
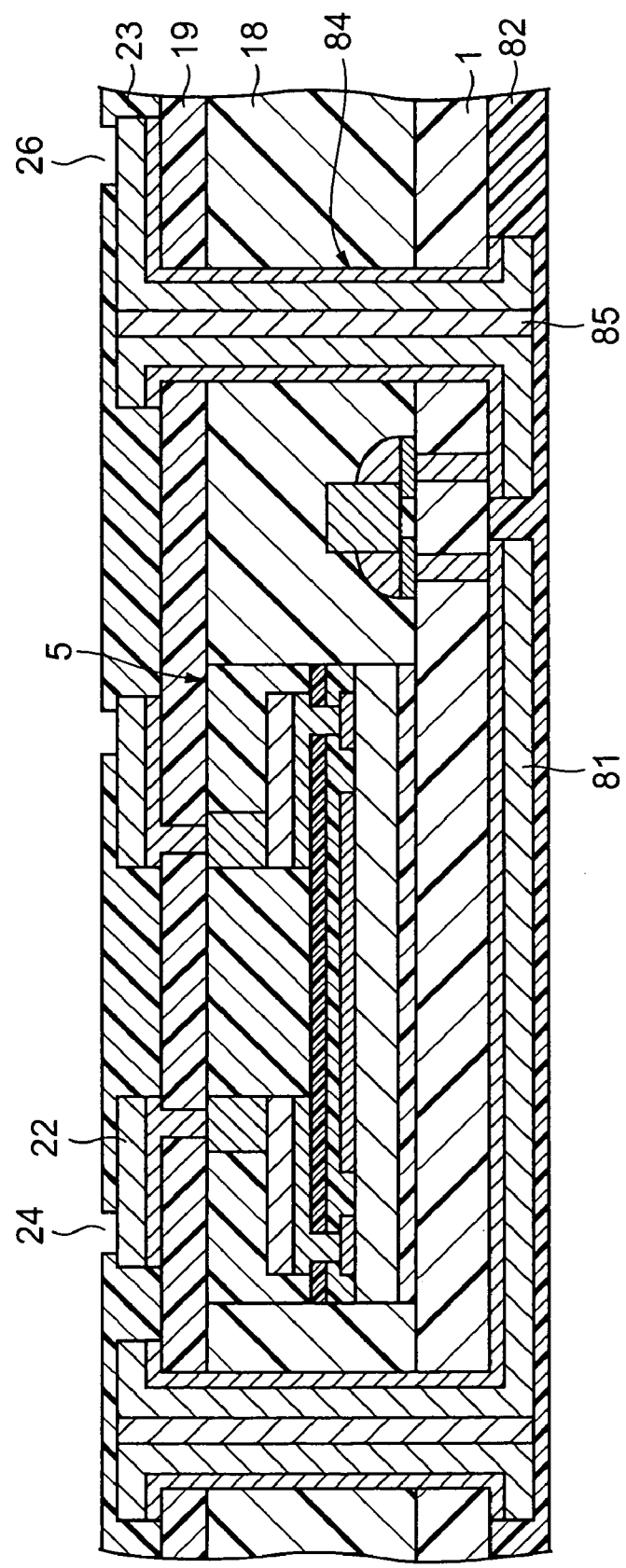
FIG. 19 is a sectional view of a process subsequent to the process shown in FIG. 18.

Next, as shown in FIG. 19, by a screen printing method, etc., a conductive material 85 made of a copper paste, a silver paste, a conductive resin, etc. is filled in the vertical conduction part 84. Next, corresponding to the necessity, an excess conductive material 85 sticking out form the vertical conduction part 84 is removed by buff polishing, etc. Next, by a screen printing method, a spin coating method, etc., an overcoat film 23 made of solder resist, etc. is formed on the upper surface of the insulation film 19 including the wiring 22. In this case, in the overcoat film 23 at parts corresponding to the connection pad part and the external connection terminal of the wiring 22, opening parts 24 and 26 are formed. And an overcoat film 82 made of solder resist, etc. is formed on the entire lower surface of the base plate 1 including the wiring 81.

Next, between the semiconductor devices 5 being adjacent to each other, when the overcoat film 23, the insulation film 19, the insulation layer 18, the base plate 1 and the overcoat film 82 were cut, a plurality of parts including the semiconductor devices 5 shown in FIG. 3 are obtained.

Next, an example of a manufacturing method of the optical sensor 61 shown in FIG. 3 is explained. First, as shown in FIG. 20, a partially formed item, in which a photoelectric conversion device area 63, a connection pad 64 made of an aluminum type metal etc., an insulation film 65 made of silicon oxide, etc. are formed on a silicon substrate (semiconductor substrate) 62 of a wafer state; and the center part of the connection pad 64 is exposed via an opening part 66 formed in the insulation film 65, is prepared.

Next, as shown in FIG. 21, on the entire upper surface of the insulation film 65 including the upper surface of the connection pad 64 exposed via the opening part 66, a bedding metal layer 68 is formed by copper electroless plating, etc. Next, a plating resist film 101 is formed on the upper surface of the bedding metal layer 68 by patterning. In this case, an opening part 102 is formed in the plating resist film 101 at a part corresponding to the region forming upper surface wiring 69.

Figure 22:
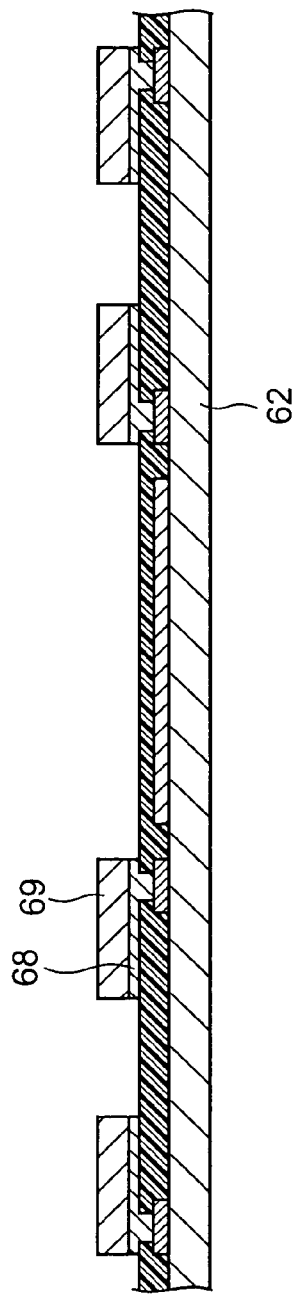
FIG. 22 is a sectional view of a process subsequent to the process shown in FIG. 21.

Next, by executing copper electro plating by using the bedding metal layer 68 as a plating current route, upper surface wiring 69 is formed on the upper surface of the bedding metal layer 68 in the opening part 102 of the plating resist film 101. Next, the plating resist film 101 is removed, and when unnecessary parts of the bedding metal layer 68 were removed by etching by using the upper surface wiring 69 as a mask, as shown in FIG. 22, the bedding metal layer 68 remains only under the upper surface wiring 69.

Figure 23:
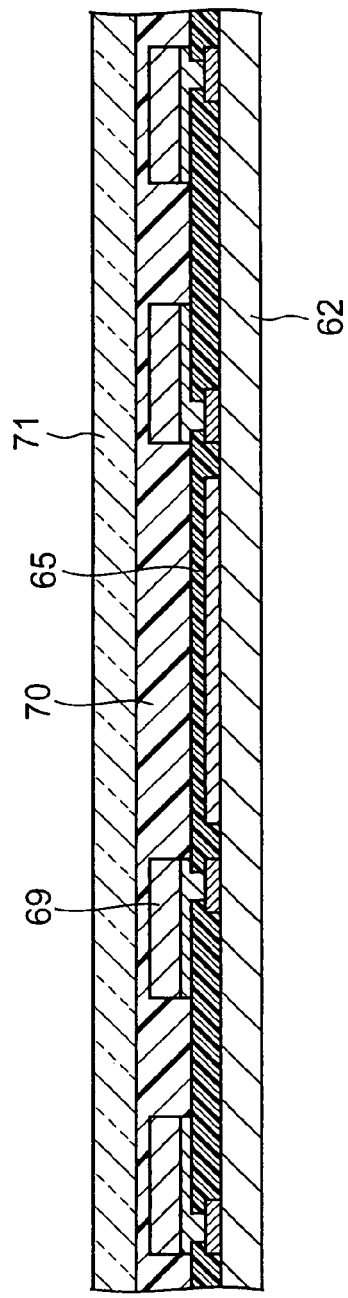
FIG. 23 is a sectional view of a process subsequent to the process shown in FIG. 22.
Figure 24:
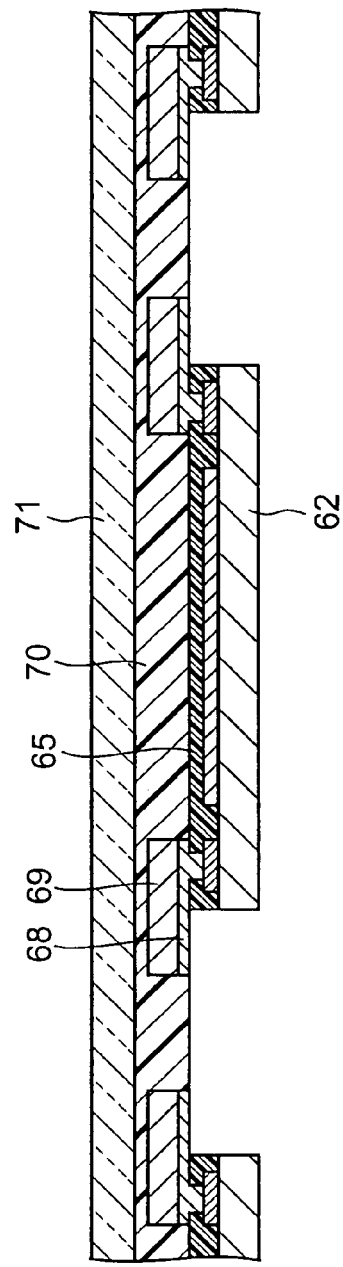
FIG. 24 is a sectional view of a process subsequent to the process shown in FIG. 23.

Next, as shown in FIG. 23, on the entire upper surface of the insulation film 65 including the upper surface wiring 69, a glass plate 71 is glued via a transparent adhesive layer 70 made of a transparent epoxy type resin, etc. Next, of the silicon substrate 62 of a wafer state, unnecessary parts not corresponding to the silicon substrate 62 shown in FIG. 3 and the insulation film 65 thereon, as shown in FIG. 24, are removed by dicing, etching, etc. Therefore, in this state, the lower surfaces of the bedding metal layer 68 and the transparent adhesive layer 70 situated around the silicon substrate 62 are exposed, and these exposed surfaces become almost the same level of the upper surface of the insulation film 65.

Figure 25:
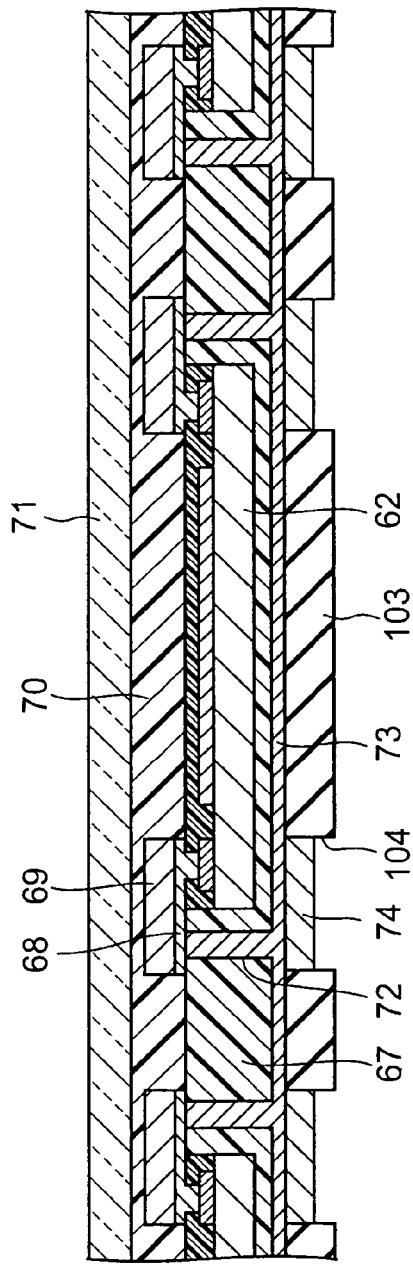
FIG. 25 is a sectional view of a process subsequent to the process shown in FIG. 24.

Next, as shown in FIG. 25, by a screen printing method, a spin coating method, etc., on the lower surface of the silicon substrate 62 including the bedding metal layer 68 and the transparent adhesive layer 70 situated around the silicon substrate 62, an insulation layer 67 made of an epoxy type resin, a polyimide type resin, etc. is formed. In this case, an opening part 72 is formed in the insulation layer 67 at a part corresponding to the connection pad part of the upper surface wiring 69 including the bedding metal layer 68.

Next, on the entire lower surface of the insulation layer 67 including the connection pad part of the upper surface wiring 69 including the bedding metal layer 68 exposed via the opening part 72, a bedding metal layer 73 is formed by copper electroless plating, etc. Next, a plating resist film 103 is formed by patterning on the lower surface of the bedding metal layer 73. In this case, an opening part 104 is formed in the plating resist film 103 at a part corresponding to the region forming the lower surface wiring 74.

Figure 26:
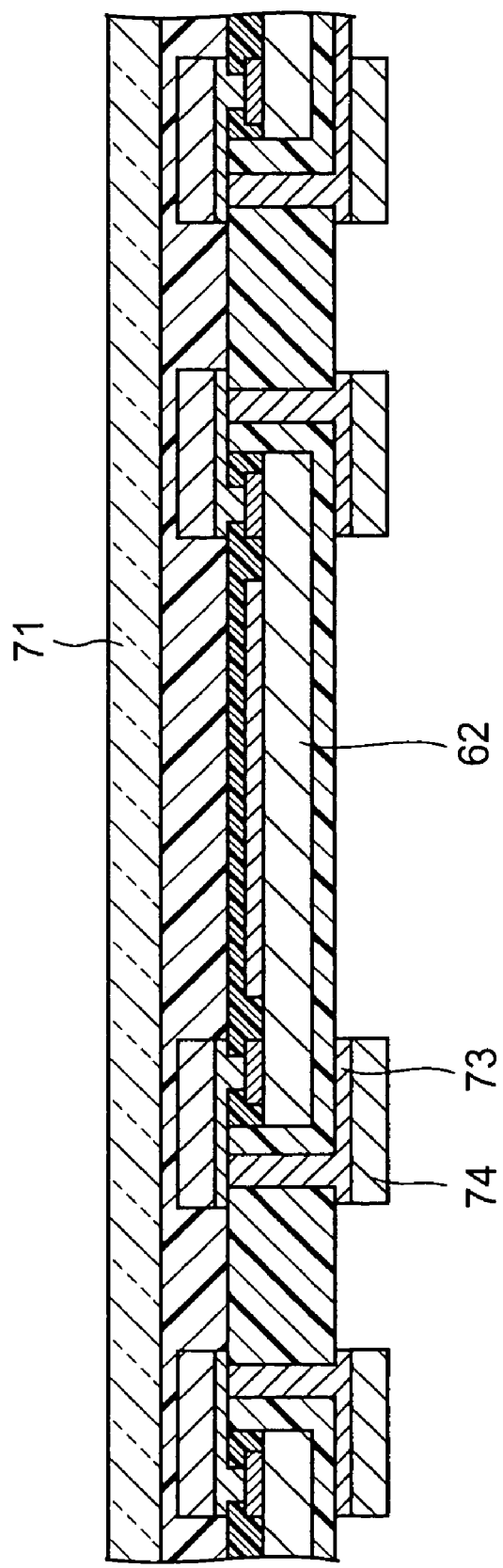
FIG. 26 is a sectional view of a process subsequent to the process shown in FIG. 25.

Next, by executing copper electroplating by using the bedding metal layer 73 as a plating current route, on the lower surface of the bedding metal layer 73 in the opening part 104 of the plating resist film 103, lower surface wiring 74 is formed. Next, the plating resist film 103 is removed, and when unnecessary parts of the bedding metal layer 73 were removed by etching by using the lower surface wiring 74 as a mask, as shown in FIG. 26, the bedding metal layer 73 remains only on the lower surface wiring 74.

Figure 27:
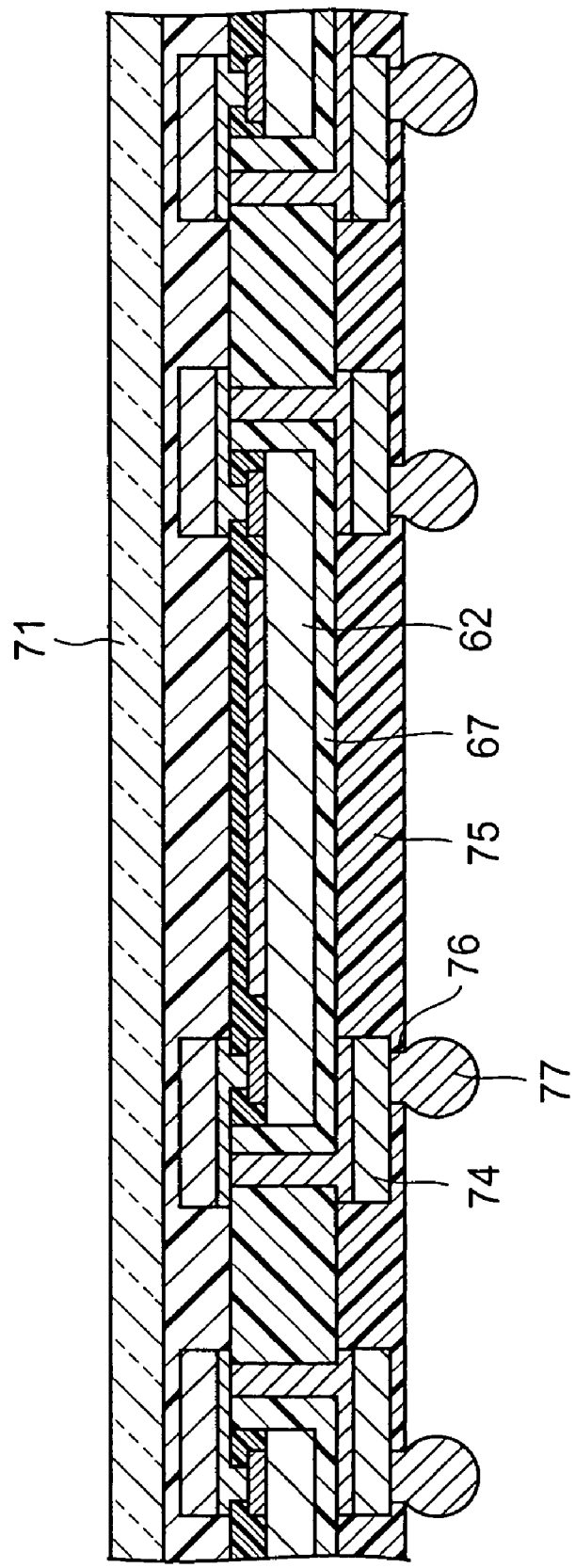
FIG. 27 is a sectional view of a process subsequent to the process shown in FIG. 26.

Next, as shown in FIG. 27, by a screen printing method, a spin coating method, etc., an overcoat film 75 made of solder resist, etc. is formed on the lower surface of the insulation layer 67 including the lower surface wiring 74. In this case, an opening part 76 is formed in the overcoat film 75 at a part corresponding to the connection pad part of the lower surface wiring 74. Next, in and under the opening part 76, a solder ball 77 is formed by connecting to the connection pad part of the lower surface wiring 74.

Figure 28:
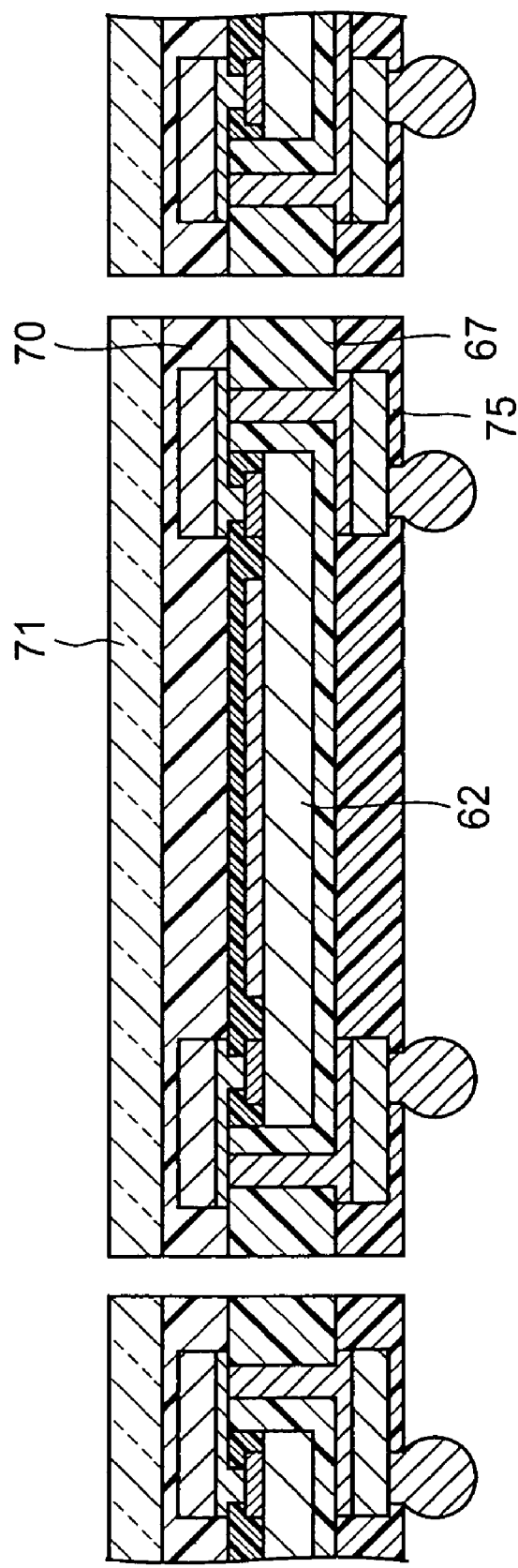
FIG. 28 is a sectional view of a process subsequent to the process shown in FIG. 27.

Next, as shown in FIG. 28, between the silicon substrate 62 being adjacent to each other, when the glass plate 71, the transparent adhesive layer 70, the insulation layer 67 and the overcoat film 75 were cut, a plurality of optical sensors 61 shown in FIG. 3 are obtained. In this, at each of the above-mentioned embodiments, the optical sensor is explained as one in which the photoelectric conversion device area is formed on the semiconductor substrate, however, as the optical sensor, one in which a photoelectric conversion element is formed by a semiconductor thin film on an insulation substrate, can be used. And the wiring 22 for connecting the semiconductor device and the optical sensor is explained in a case of only one layer, the wiring forming on the semiconductor device can be a plurality of layers using a dielectric inter layer. And the overcoat film 23 covering the wiring 22 is made of solder resist, however, can be made of other materials such as a buildup material. Further, as the overcoat film 23, an insulation resin sheet formed in a sheet shape beforehand, in which a glass fiber etc. are distributed, is glued by a thermo compression bonding, etc., can be used, by not forming a film by using a screen printing method, a coating method, etc.

Fifth Embodiment

Figure 29:
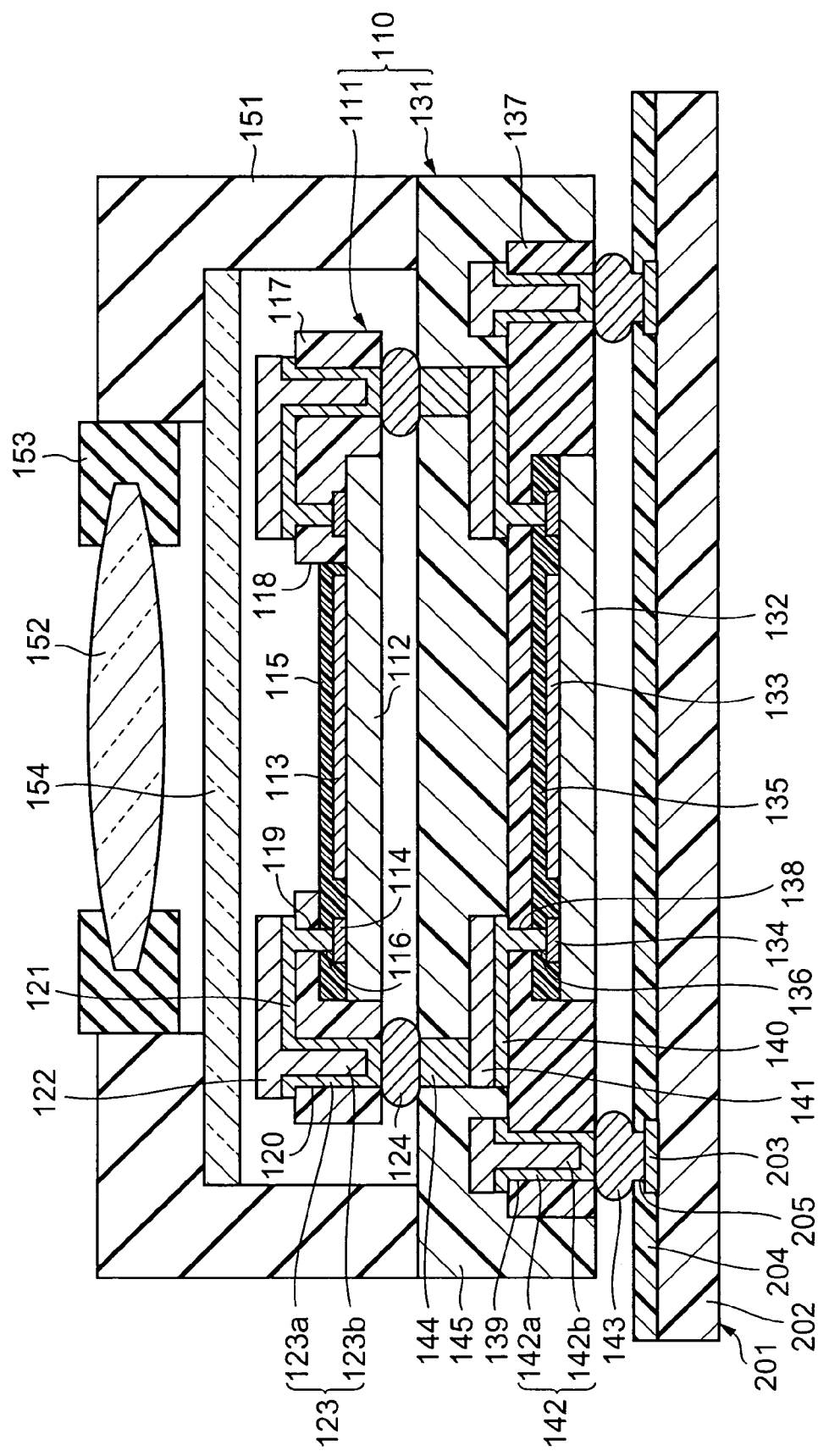
FIG. 29 is a sectional view of an optical sensor module according to a fifth embodiment of the present invention.

FIG. 29 is a sectional view of an optical sensor module according to a fifth embodiment of the present invention. In this embodiment, an optical sensor module 110 is mounted on a circuit board 201. The circuit board 201 has a structure, in which a plurality of connection pads 203 made of an aluminum type metal, etc. are situated on the upper surface of an insulation substrate 202 made of a glass cloth base epoxy resin, etc., an overcoat film 204 made of solder resist, etc. is situated on the upper surface of the insulation substrate 202 except the center part of the connection pads 203, and the center part of the connection pads 203 is exposed via an opening part 205 formed in the overcoat film 204.

The optical sensor module 110 provides an optical sensor 111 and semiconductor structure 131 having a function as a peripheral drive circuit of the optical sensor 111. First, the structure of the optical sensor 111 is explained. The optical sensor 111 provides a silicon substrate (semiconductor substrate) 112. On the center part of the upper surface of the silicon substrate 112, a photoelectric conversion device area 113 including elements such as a CCD, a photodiode, a phototransistor, etc. is formed, on the rimpart of the upper surface of the silicon substrate 112, a plurality of connection pads 114 made of an aluminum type metal, etc. are formed by connecting to the photoelectric conversion device area 113.

On the upper surface of the silicon substrate 112 except the center part of the connection pads 114, a protection film 115 made of silicon oxide, etc. is situated, and the center part of the connection pads 114 are exposed via opening parts 116 formed in the protection film 115. On the upper surface of the protection film 115 and around the silicon substrate 112, an insulation layer 117 made of an epoxy type resin, a polyimide type resin, etc. is formed. In this case, the level of the lower surface of the insulation layer 117 situated outside the side surface of the silicon substrate 112 is the same level of the lower surface of the silicon substrate 112.

At a part in the insulation layer 117 corresponding to the photoelectric conversion device area 113, an opening part 118 is formed. At a part in the insulation layer 117 corresponding to the opening parts 116 of the protection film 115, an opening part 119 is formed. At a predetermined position of the insulation layer 117 formed outside the side surface of the silicon substrate 112, a through hole 120 is formed.

On the upper surface of the insulation layer 117, a bedding metal layer 121 made of copper, etc. is formed. On the entire upper surface of the bedding metal layer 121, wiring 122 made of copper is formed. One end part of the wiring 122 including the bedding metal layer 121 is connected to the connection pads 114 via the opening part 119 in the protection film 115. The other end part of the wiring 122 including the bedding metal layer 121 is connected to a penetrating electrode 123 composed of a bedding metal layer 123a and a copper layer 123b formed in a through hole 120 of the protection film 115 in an integrated manner. In this case, the level of the lower surface of the penetrating electrode 123 is the same level of the lower surface of the insulation layer 117. On the lower surface of the penetrating electrode 123, a solder ball 124 is situated.

Next, the configuration of the semiconductor structure 131 is explained. The semiconductor structure 131 provides a silicon substrate (semiconductor substrate) 132. On the center part of the upper surface of the silicon substrate 132, an integrated circuit 133 having a predetermined function is situated, and on the rim part of the upper surface of the silicon substrate 132, a plurality of connection pads 134 (electrodes for connecting to an external device) made of an aluminum type metal, etc. are formed by connecting to the integrated circuit 133. On the upper surface of the silicon substrate 132 except the center part of the connection pads 134, a protection film 135 made of silicon oxide, etc. is formed, and the center part of the connection pads 134 is exposed via an opening part 136 formed in the protection film 135.

On the upper surface of the protection film 135 and around the silicon substrate 132, an insulation layer 137 made of an epoxy type resin, a polyimide type resin, etc. is formed. In this case, the level of the lower surface of the insulation layer 137 formed outside of the side surface of the silicon substrate 132 is the same level of the lower surface of the silicon substrate 132. At a part of the insulation layer 137 corresponding to the opening part 136 in the protection film 135, an opening part 138 is formed. At a predetermined position of the insulation layer 137 formed outside of the side surface of the silicon substrate 132, a through hole 139 is formed.

On the upper surface of the insulation layer 137, a bedding metal layer 140 made of copper, etc. is formed. On the entire upper surface of the bedding metal layer 140, wiring 141 made of copper is formed. One end part of the wiring 141 including the bedding metal layer 140 is connected to the connection pads 134 via a protective film and the opening parts 136 and 138 in the insulation layers 135 and 137. A part of the other end part of the wiring 141 including the bedding metal layer 140 is connected to a penetrating electrode 142 composed of a bedding metal layer 142a and a copper layer 142b formed in a through hole 139 of the insulation layer 137 in an integrated manner. In this case, the level of the lower surface of the penetrating electrode 142 is the same level of the lower surface of the insulation layer 137. On the lower surface of the penetrating electrode 142, a solder ball 143 is situated.

On the upper surface of a part of the connection pad part of the wiring 141, pillar-shaped electrodes (electrodes for connecting to an external device) 144 are formed. On and around the upper surface of the insulation layer 137 including the pillar-shaped electrodes 144 (electrodes for connecting to an external device) and the wiring 141, a sealing film 145 made of an epoxy type resin, a polyimide type resin, etc. is formed in a manner that the upper surface thereof is the same level of the upper surface of the pillar-shaped electrodes 144. In this case, the level of the lower surface of the sealing film 145 formed outside of the side surface around the insulation layer 137 is the same level of the lower surface of the insulation layer 137.

And the optical sensor 111 is mounted on the semiconductor structure 131, by that the solder ball 124 is connected to the upper surface of the pillar-shaped electrodes 144 of the semiconductor structure 131. And the optical sensor module 110 composed of the optical sensor 111 and the semiconductor structure 131 is mounted on the circuit board 201 by that the solder ball 143 of the semiconductor structure 131 is connected to the connection pad 203 of the circuit board 201.

On the upper surface of the sealing film 145 of the semiconductor structure 131 around the optical sensor 111, a lens holder 151 is situated. To the lens holder 151, a holding cylinder 153 for holding a lens 152 situated above the photoelectric conversion device area 113 of the optical sensor 111 is attached in a manner that the holding cylinder 153 can rotate. In the lens holder 151, between the optical sensor 111 and the lens 152, an infrared ray absorption filter 154 is situated.

Figure 30:
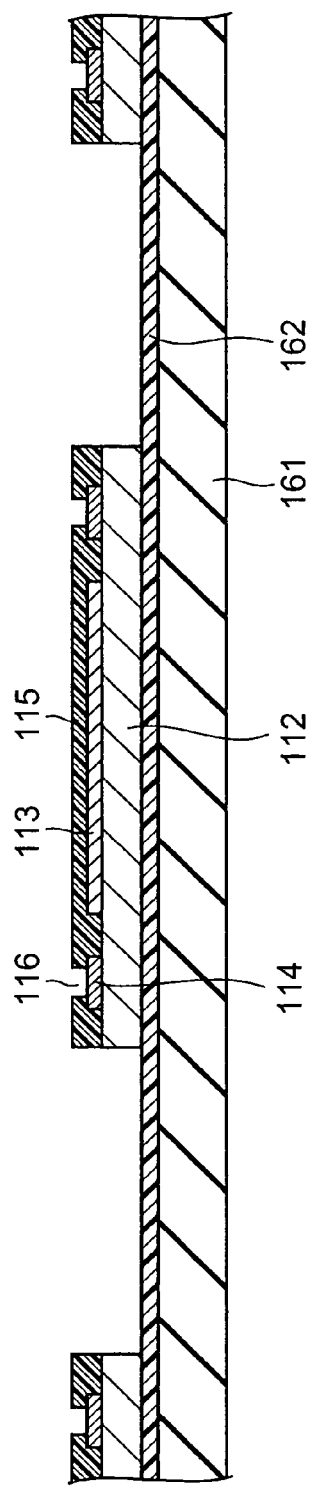
FIG. 30 is a sectional view of an initial process during manufacturing an optical sensor shown in FIG. 29.

Next, an example of a manufacturing method of the optical sensor module 110 composed of the optical sensor 111 and the semiconductor structure 131 is explained. First, an example of a manufacturing method of the optical sensor 111 is explained. First, as shown in FIG. 30, a partially formed item, in which on the upper surface of a holding plate 161 composed of an ultraviolet ray transmitting glass plate, a transparent metal plate, a transparent resin plate, etc.; an adhesive layer 162 whose adhesive strength is lowered by radiating ultraviolet rays is situated, is prepared.

Next, at a plurality of predetermined positions of the upper surface of the adhesive layer 162, the lower surface of the silicon substrate 112 is glued. In this case, on the silicon substrate 112, a photoelectric conversion device area 113, a connection pad 114 made of an aluminum type metal, etc., a protection film 115 made of silicon oxide, etc. are formed, and the center part of the connection pad 114 is exposed via opening parts 116 formed in the protection film 115.

Figure 31:
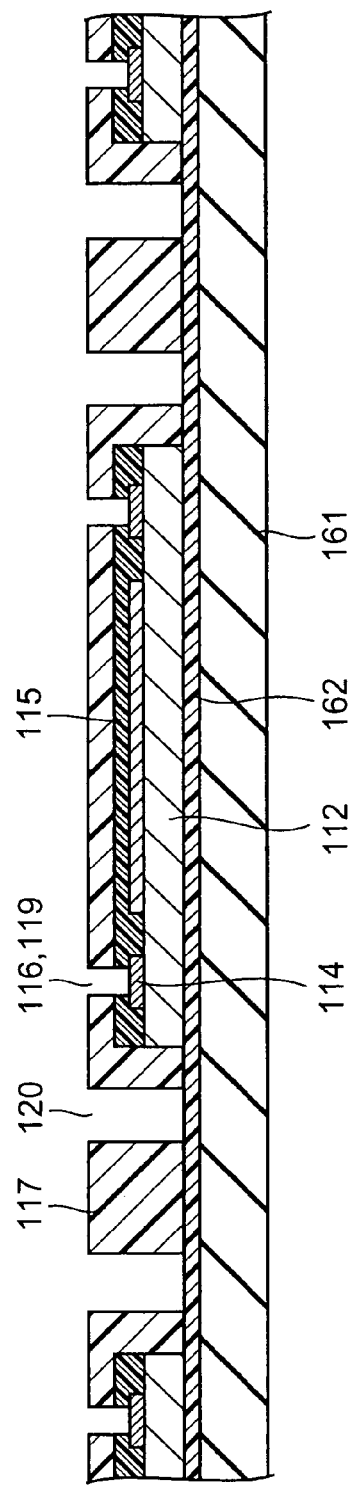
FIG. 31 is a sectional view of a process subsequent to the process shown in FIG. 30.

Next, as shown in FIG. 31, on the upper surface of the adhesive layer 162 including the protection film 115, by a screen printing method, a spin coating method, etc., an insulation layer 117 made of an epoxy type resin, a polyimide type resin, etc. is formed. In this case, at a part of the insulation layer 117 corresponding to the opening parts 116 in the protection film 115, an opening part 119 is formed. And at a predetermined position of the insulation layer 117 formed outside the side surface of the silicon substrate 112, a through hole 120 is formed.

Figure 32:
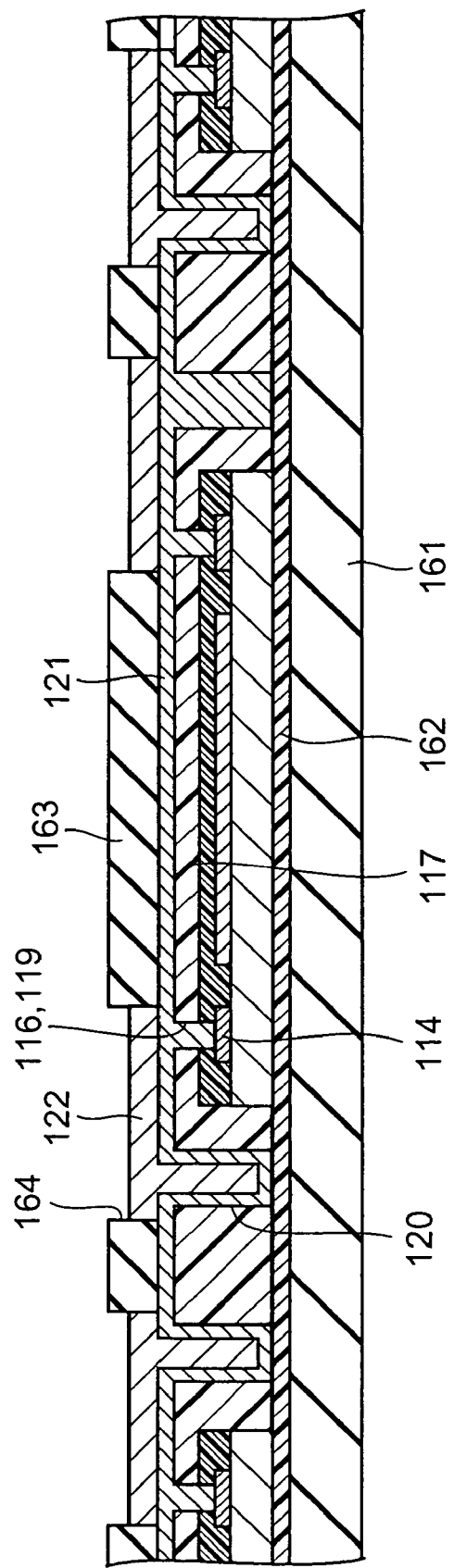
FIG. 32 is a sectional view of a process subsequent to the process shown in FIG. 31.

Next, as shown in FIG. 32, on the upper surface of the connection pad 114 exposed via both of the opening parts 116 and 119, and on the entire upper surface of the insulation layer 117 including the upper surface of the adhesive layer 162 exposed via the through hole 120, a bedding metal layer 121 is formed. In this case, the bedding metal layer 121 can be only a copper layer formed by electroless plating, or only a copper layer formed by sputtering, further a material in which a copper layer is formed by sputtering on a thin film layer of titanium, etc. formed by sputtering.

Next, on the upper surface of the bedding metal layer 121, a plating resist film 163 is formed by pattering. In this case, at a part of the plating resist film 163 corresponding to the region forming wiring 122, an opening part 164 is formed. Next, by executing copper electro plating by using the bedding metal layer 121 as a plating current route, on the upper surface of the bedding metal layer 121 in the opening part 164 of the plating resist film 163, the wiring 122 is formed.

Figure 33:
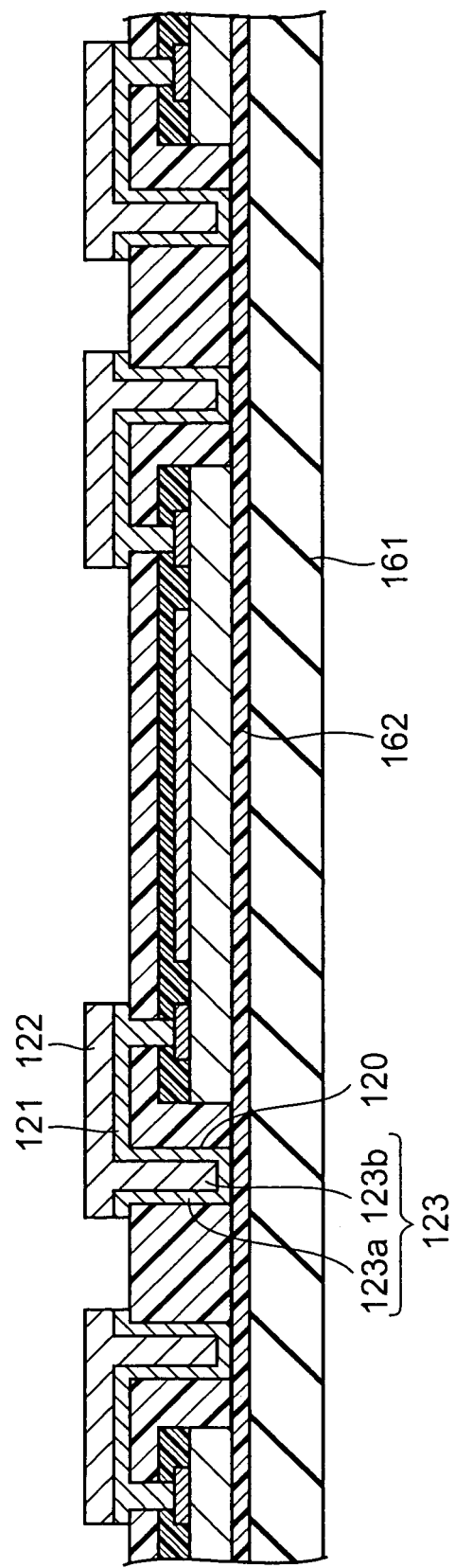
FIG. 33 is a sectional view of a process subsequent to the process shown in FIG. 32.

Next, the plating resist film 163 is removed, and when unnecessary parts of the bedding metal layer 121 were removed by etching by using the wiring 122 as a mask, as shown in FIG. 33, the bedding metal layer 121 remains only under the wiring 122. And in this state, in the through hole 120, a penetrating electrode 123 composed of a bedding metal layer 123a and a copper layer 123b is formed.

Figure 34:
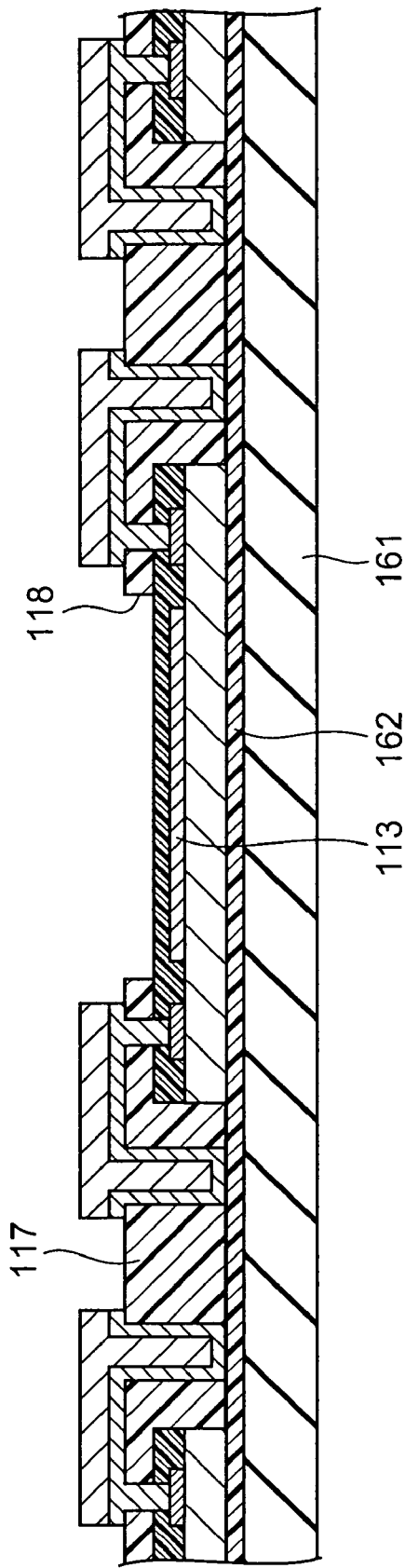
FIG. 34 is a sectional view of a process subsequent to the process shown in FIG. 33.
Figure 35:
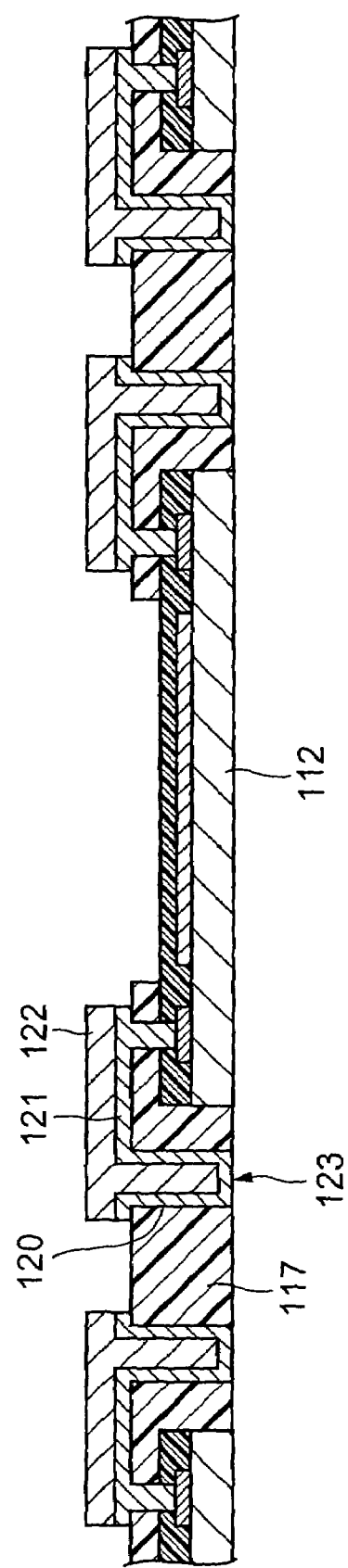
FIG. 35 is a sectional view of a process subsequent to the process shown in FIG. 34.

Next, as shown in FIG. 34, at a part of the insulation layer 117 corresponding to the photoelectric conversion device area 113, an opening part 118 is formed by a photo lithography method. In this, the opening part 118 can be formed at the process shown in FIG. 31. Next, the adhesive strength of the adhesive layer 162 is lowered by radiating ultraviolet rays from the lower surface side of the holding plate 161, and when the holding plate 161 and the adhesive layer 162 were removed, one shown in FIG. 35 is obtained.

In this state, the level of the lower surface of the insulation layer 117 formed outside the side surface of the silicon substrate 112 and the level of the lower surface of the penetrating electrode 123 formed in the through hole 120 are the same level of the lower surface of the silicon substrate 112. Next, in case that an adhesive is on the lower surface of the penetrating electrode 123 formed in the through hole 120, the adhesive is removed by plasma etching, etc.

Figure 36:
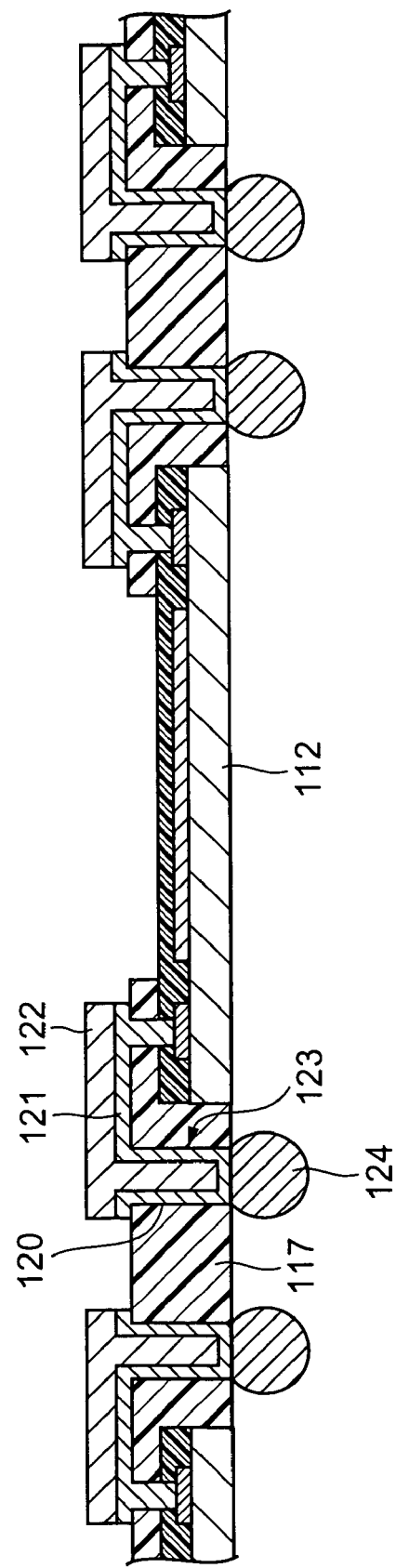
FIG. 36 is a sectional view of a process subsequent to the process shown in FIG. 35.
Figure 37:
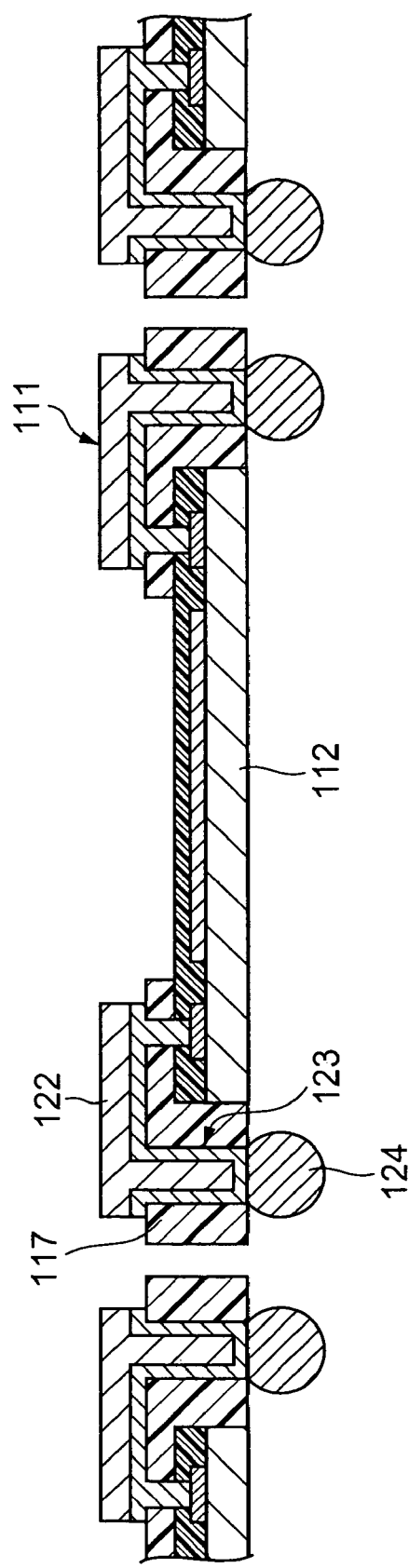
FIG. 37 is a sectional view of a process subsequent to the process shown in FIG. 36.

Next, as shown in FIG. 36, on the lower surface of the penetrating electrode 123 formed in the through hole 120, as older ball 124 is formed. Next, as shown in FIG. 37, when the insulation layer 117 was cut between the silicon substrate 112 adjacent to each other, as shown in FIG. 29, a plurality of optical sensors 111 (in FIG. 1, optical sensor 35) having the penetrating electrode 123 outside the side surface of the silicon substrate 112 can be obtained.

Next, an example of a manufacturing method of the semiconductor structure 131 is explained. First, as shown in FIG. 38, a partially formed item, in which on the upper surface of a holding plate 171 composed of an ultraviolet ray transmitting glass plate, a transparent metal plate, a transparent resin plate, etc.; an adhesive layer 172 whose adhesive strength is lowered by radiating ultraviolet rays is situated, is prepared. In this, in FIG. 38, the region shown by the reference number 173 is a region corresponding to the dicing line.

Next, at a plurality of predetermined positions of the upper surface of the adhesive layer 172, the lower surface of the silicon substrate 132 is glued. In this case, on the silicon substrate 132, an integrated circuit, a connection pad 134 made of an aluminum type metal, etc., a protection film 135 made of silicon oxide, etc. are formed, and the center part of the connection pad 134 is exposed via an opening part 136 formed in the protection film. 135.

Next, as shown in FIG. 39, on the upper surface of the adhesive layer 172 including the protection film 135, by a screen printing method, a spin coating method, etc., an insulation layer 137 made of an epoxy type resin, a polyimide type resin, etc. is formed. In this case, at a part of the insulation layer 137 corresponding to the opening part 136 in the protection film 135, an opening part 138 is formed. And at a predetermined position of the insulation layer 137 formed outside the side surface of the silicon substrate 132, a through hole 139 is formed. Further, in the insulation layers 137 and at both side regions of the dicing lines 173, through holes 174 are formed.

Figure 40:
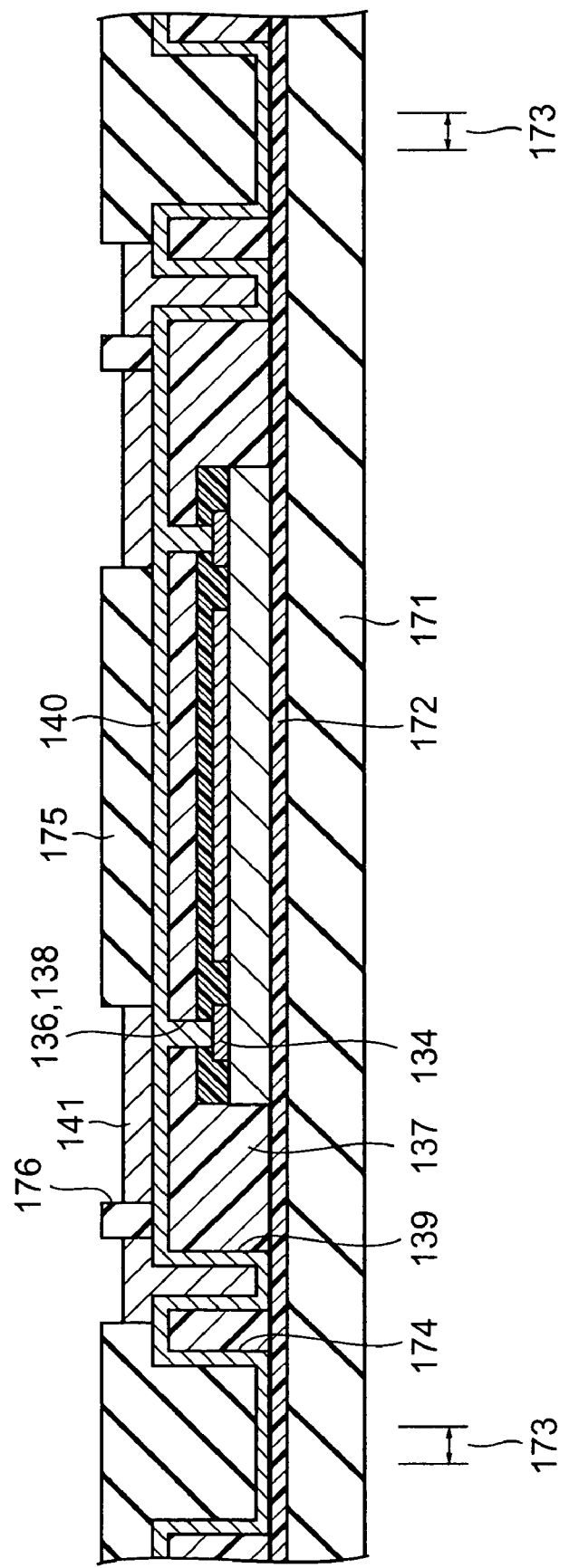
FIG. 40 is a sectional view of a process subsequent to the process shown in FIG. 39.

Next, as shown in FIG. 40, on the upper surface of the connection pads 134 exposed via both of the opening parts 136 and 138, and on the entire upper surface of the insulation layer 137 including the upper surface of the adhesive layer 172 exposed via the through holes 139 and 174, a bedding metal layer 140 is formed by copper electroless plating, etc. Next, on the upper surface of the bedding metal layer 140, patterning forms a plating resist film 175. In this case, at a part of the plating resist film 175 corresponding to the region forming wiring 141, an opening part 176 is formed. Next, by executing copper electro plating by using the bedding metal layer 140 as a plating current route, on the upper surface of the bedding metal layer 140 in the opening part 176 of the plating resist film 175, the wiring 141 is formed. Next, the plating resist film 175 is removed.

Figure 41:
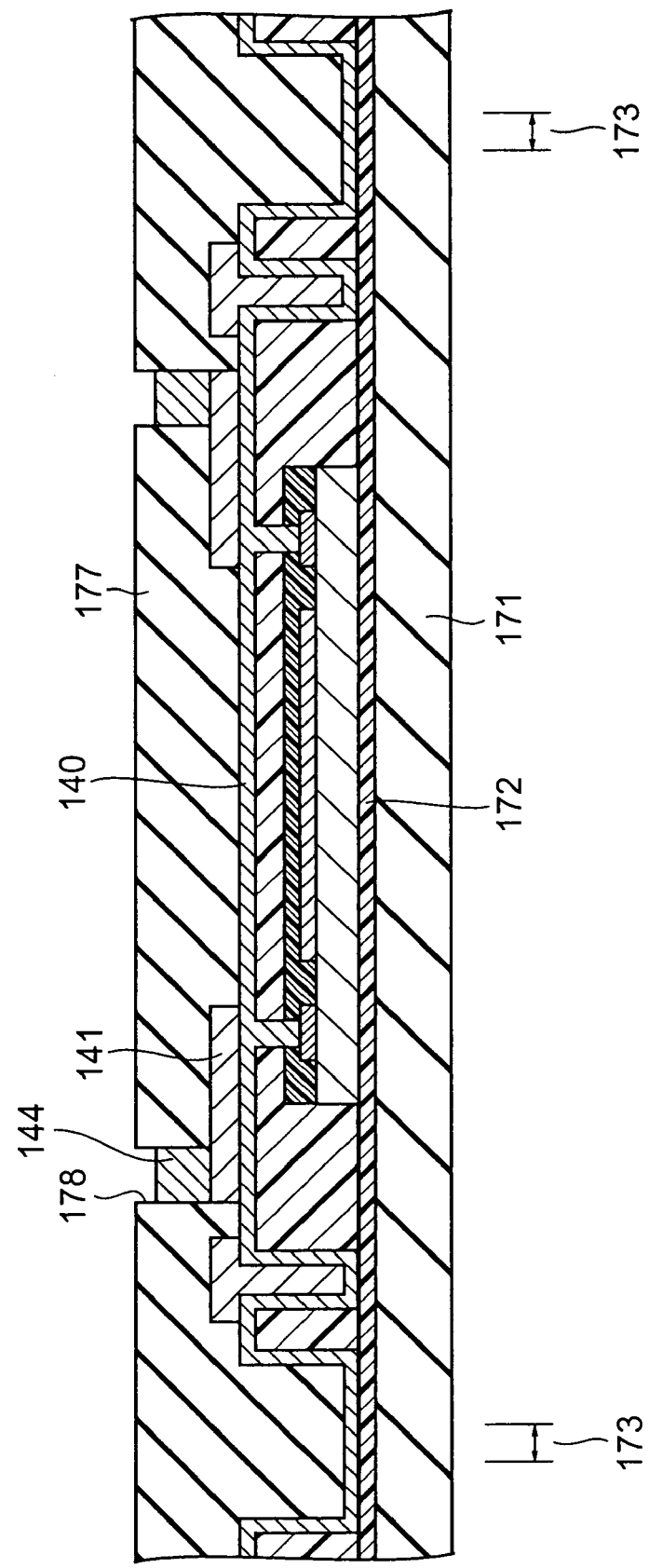
FIG. 41 is a sectional view of a process subsequent to the process shown in FIG. 40.

Next, as shown in FIG. 41, on the upper surface of the bedding metal layer 140 including the wiring 141, a plating resist film 177 is formed by patterning. In this case, at a part of the plating resist film 177 corresponding to the region forming pillar-shaped electrodes 144, an opening part 178 is formed. Next, by executing copper electro plating by using the bedding metal layer 140 as a plating current route, on the upper surface of the connection pad part of the wiring 141 in the opening part 178 of the plating resist film 177, the pillar-shaped electrodes 144 are formed.

Figure 42:
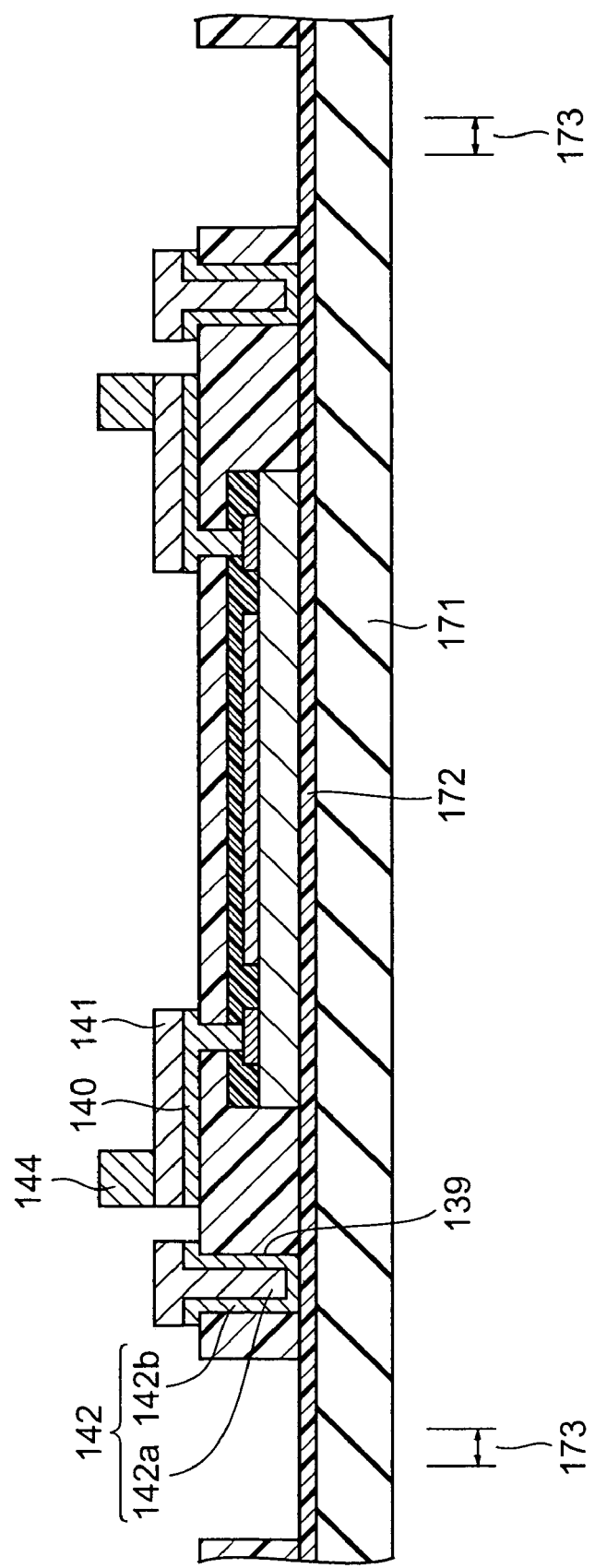
FIG. 42 is a sectional view of a process subsequent to the process shown in FIG. 41.

Next, the plating resist film 177 is removed, and when unnecessary parts of the bedding metal layer 140 were removed by etching by using the wiring 141 as a mask, as shown in FIG. 42, the bedding metal layer 140 remains only under the wiring 141. And in this state, a penetrating electrode 142 composed of a bedding metal layer 142a and a copper layer 142b is formed in the through hole 139.

Figure 43:
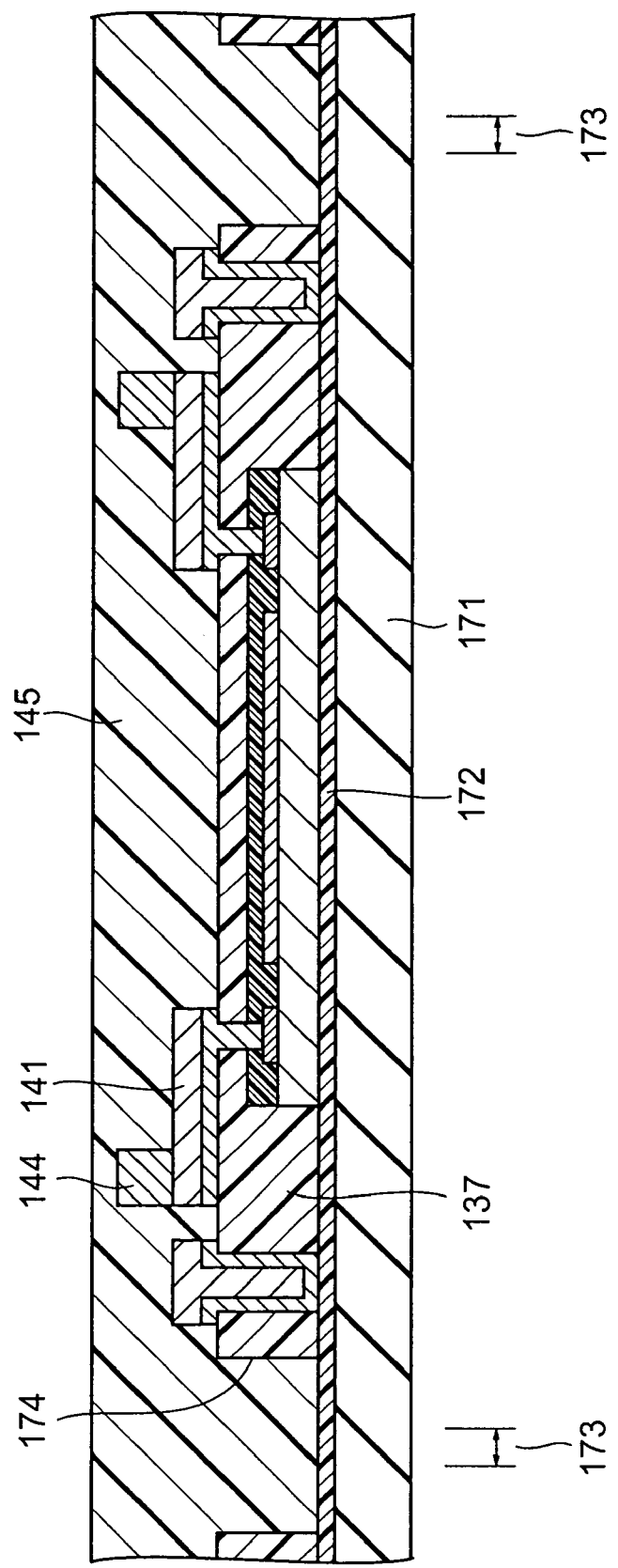
FIG. 43 is a sectional view of a process subsequent to the process shown in FIG. 42.

Next, as shown in FIG. 43, by a screen printing method, a spin coating method, a die coating method, etc., on the entire upper surface of the protection film 135 including the pillar-shaped electrode 144 and the wiring 141, and on the upper surface of the adhesive layer 172 exposed via the through hole 174, a sealing film 145 made of an epoxy type resin, a polyimide type resin, etc. is formed in a manner that the thickness of the sealing film 145 is thicker than the height of the pillar-shaped electrodes 144. Therefore, in this state, the upper surface of the pillar-shaped electrodes 144 are covered with the sealing film 145.

Figure 44:
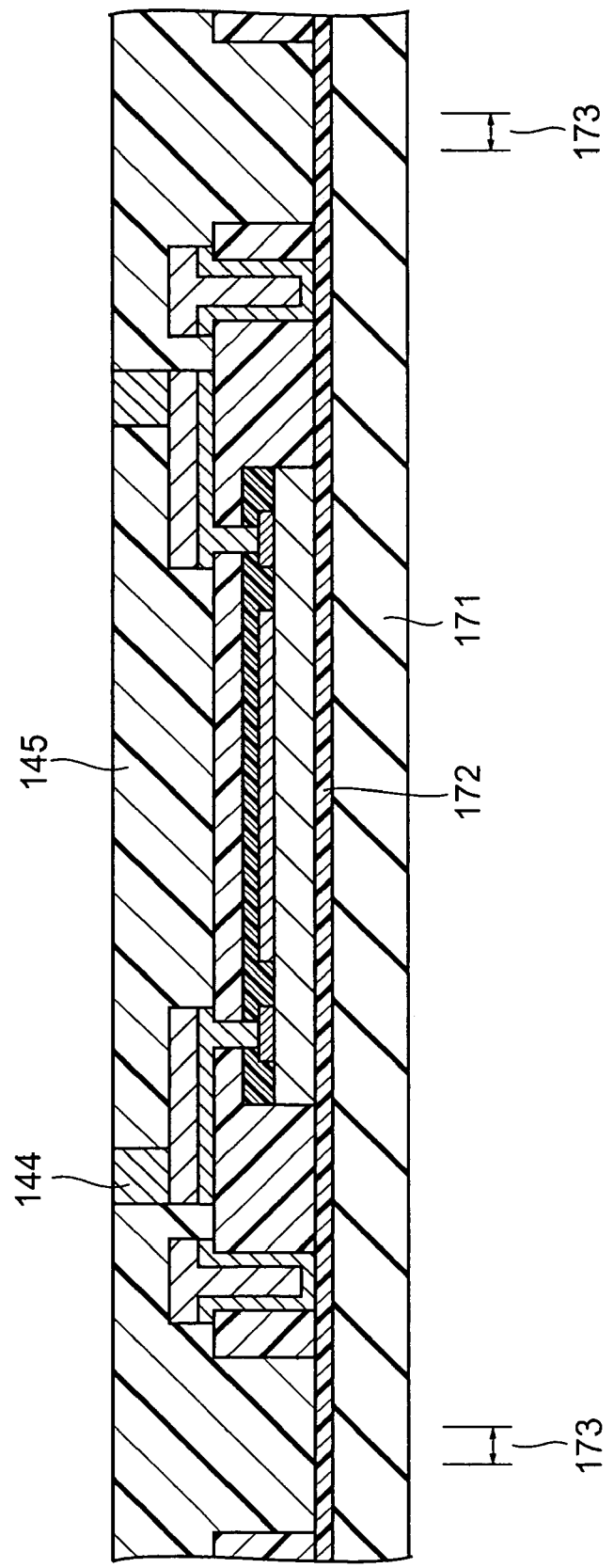
FIG. 44 is a sectional view of a process subsequent to the process shown in FIG. 43.

Next, the upper surface sides of the sealing film 145 and the pillar-shaped electrode 144 are properly polished, and as shown in FIG. 44, the upper surface of the pillar-shaped electrodes 144 is exposed, and the upper surface of the sealing film 145 including the upper surface of the exposed pillar-shaped electrodes 144 are flattened. In this, the reason why the upper surface side of the pillar-shaped electrodes 144 are properly polished is, there is dispersion in the height of the pillar-shaped electrodes 144 formed by electro plating, to get rid of this dispersion, and to make the height of the pillar-shaped electrodes 144 uniform.

Figure 45:
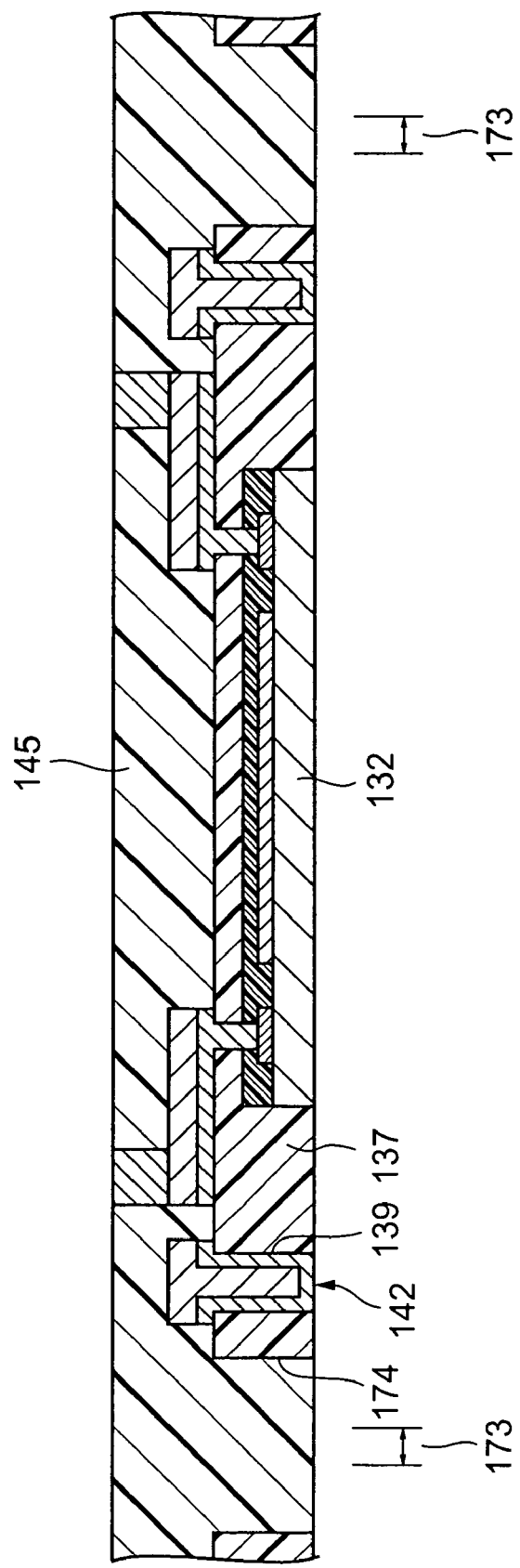
FIG. 45 is a sectional view of a process subsequent to the process shown in FIG. 44.

Next, the adhesive strength of the adhesive layer 172 is lowered by radiating ultraviolet rays from the lower surface side of the holding plate 171, and when the holding plate 171 and the adhesive layer 172 were removed, one shown in FIG. 45 is obtained. In this state, the level of the lower surface of the insulation layer 137 formed outside the side surface of the silicon substrate 132, the level of the lower surface of the penetrating electrode 142 formed in the through hole 139 and the level of the lower surface of the sealing film 145 formed in the through hole 174 are the same level of the lower surface of the silicon substrate 132. Next, in case that an adhesive is on the lower surface of the penetrating electrode 142 formed in the through hole 139, the adhesive is removed by plasma etching, etc.

Figure 46:
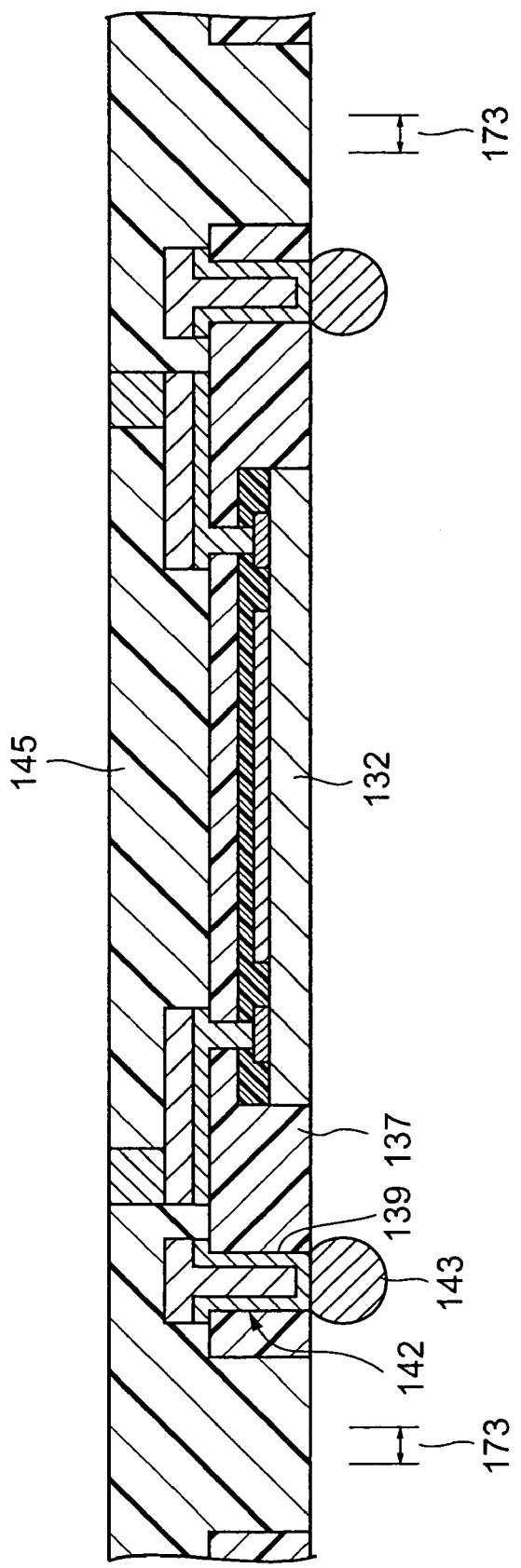
FIG. 46 is a sectional view of a process subsequent to the process shown in FIG. 45.
Figure 47:
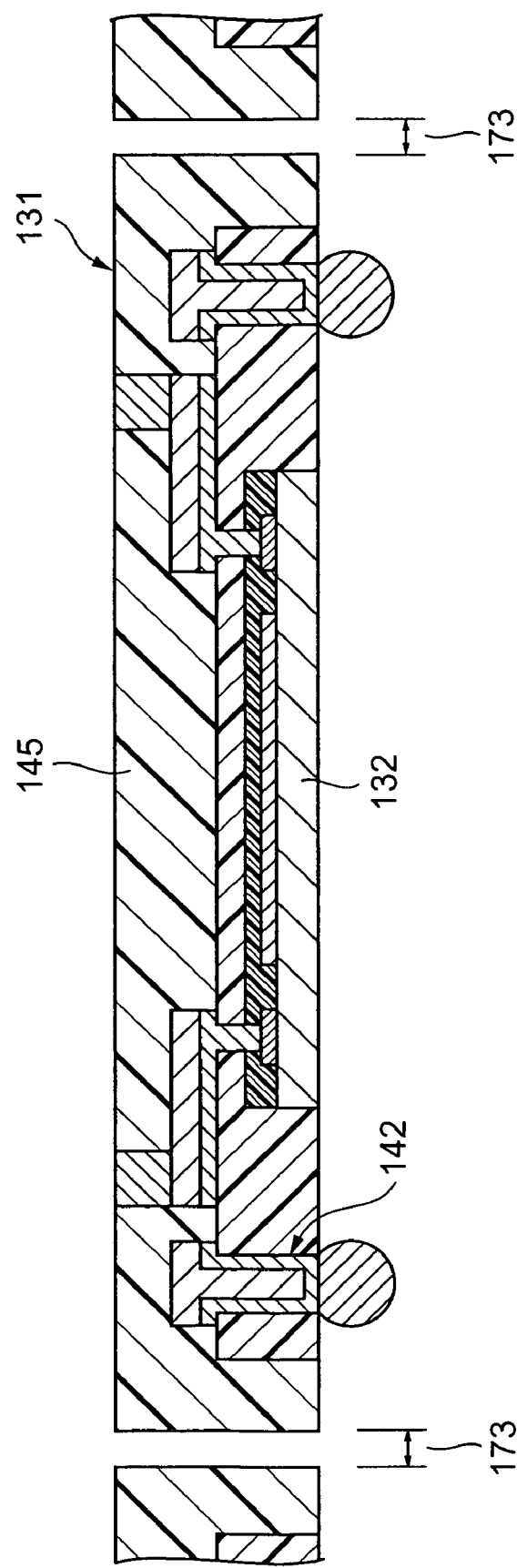
FIG. 47 is a sectional view of a process subsequent to the process shown in FIG. 46.

Next, as shown in FIG. 46, on the lower surface of the penetrating electrode 142 formed in the through hole 139, as older ball 143 is formed. Next, as shown in FIG. 47, when the sealing film 145 between the silicon substrates 132 adjacent to each other was cut along the dicing lines 173, as shown in FIG. 29, a plurality of semiconductor structures 131 having the penetrating electrodes 142 outside the side surfaces of the silicon substrate 132 are obtained.

And when the explanation is performed by referring to FIG. 29, the solder balls 143 of the semiconductor structure 131 is positioned on the connection pads 203 of the circuit board 201, and the solder balls 124 of the optical sensor 111 are positioned on the pillar-shaped electrodes 144 of the semiconductor structure 131, next, the solder balls 143 of the semiconductor structure 131 are bonded to the connection pads 203 of the circuit board 201 by reflow, and the solder balls 124 of the optical sensor 111 are bonded on the upper surfaces of the pillar-shaped electrodes 144 of the semiconductor structure 131 by reflow, with this, the optical sensor module 110 composed of the optical sensor 111 and the semiconductor structure 131 is mounted on the circuit board 201.

As mentioned above, the optical sensor 111 having the photoelectric conversion device area 113 in its upper surface is, via the solder balls 124 situated under the penetrating electrodes 123 formed on its lower surface, mounted on the semiconductor structure 131 having the function as the peripheral drive circuit of the optical sensor 111. Therefore, even the photoelectric conversion device area 113 and the connection pads 114 connected to the photoelectric conversion device area 113 are provided in the upper surface of the optical sensor 111, the mounting can be executed without using bonding wires or a flexible wiring board, consequently, the optical sensor 111 can be mounted easily.

And also, the semiconductor structure 131 is, via the solder balls 143 formed under the penetrating electrodes 142 situated in its lower surface, mounted on the circuit board 201, therefore, the mounting can be executed without using bonding wires or a flexible wiring board, consequently, the semiconductor structure 131 can be also mounted easily.

In this, it is possible that the semiconductor structure 131 is mounted on the circuit board 201, and next, the optical sensor 111 is mounted on the semiconductor structure 131. Further, it is possible that the optical sensor 111 is mounted on the semiconductor structure 131, and next, the optical sensor module 110 composed of the optical sensor 111 and the semiconductor structure 131 is mounted on the circuit board 201.

Figure 48:
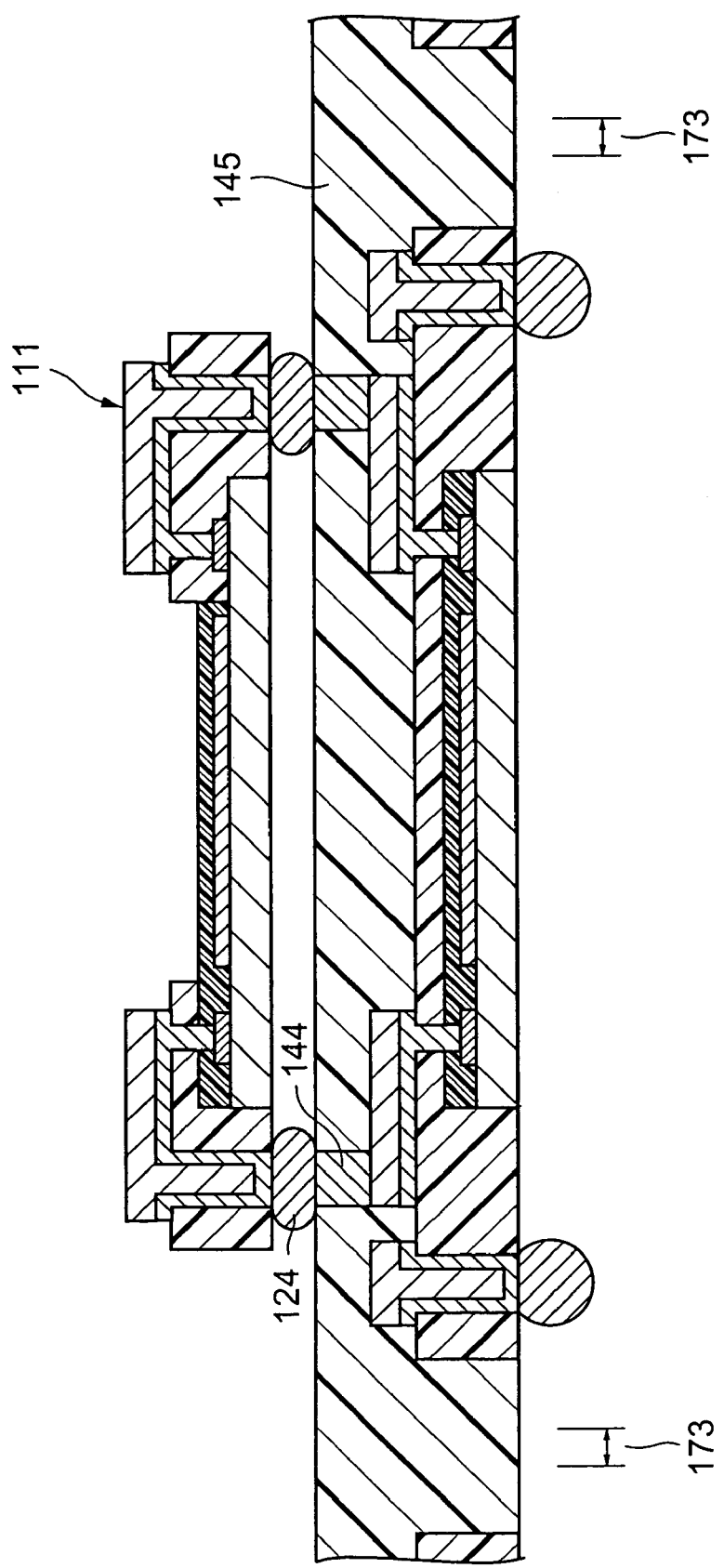
FIG. 48 is a sectional view of a process for explaining another example of a manufacturing method of an optical sensor and a semiconductor device.
Figure 49:
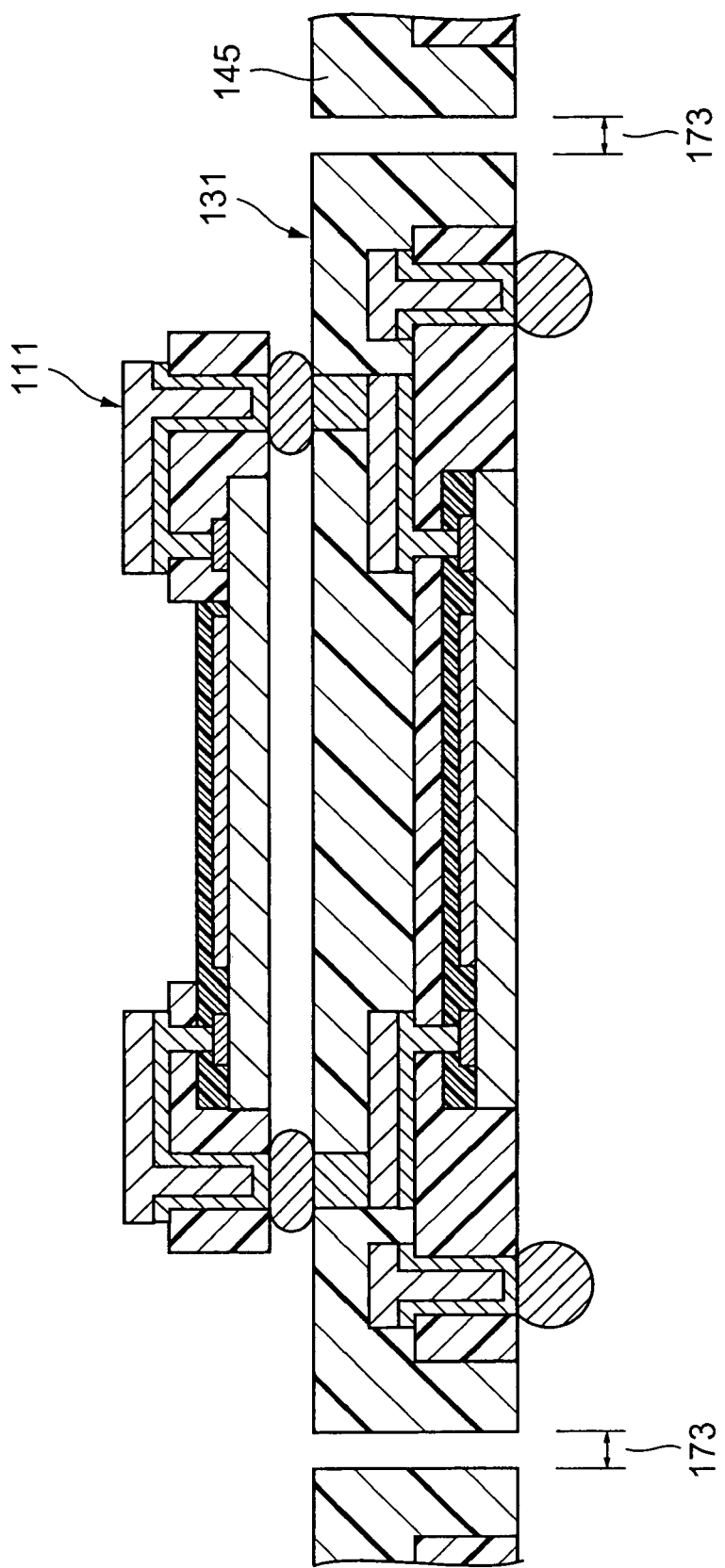
FIG. 49 is a sectional view of a process subsequent to the process shown in FIG. 48.

And at the above-mentioned embodiment, as shown in FIG. 47, the sealing film 145 is cut along the dicing lines 173, and each of the semiconductor structure 131 is separated, however, the embodiment is not limited to this. For example, after the process shown in FIG. 46, as shown in FIG. 48, the solder balls 124 of the optical sensor 111 which is made one piece are bonded to the corresponding pillar-shaped electrodes 144, next, as shown in FIG. 49, the sealing film 145 is cut along the dicing lines 173, and each of the semiconductor structures 131 are separated. This is also possible.

Figure 50:
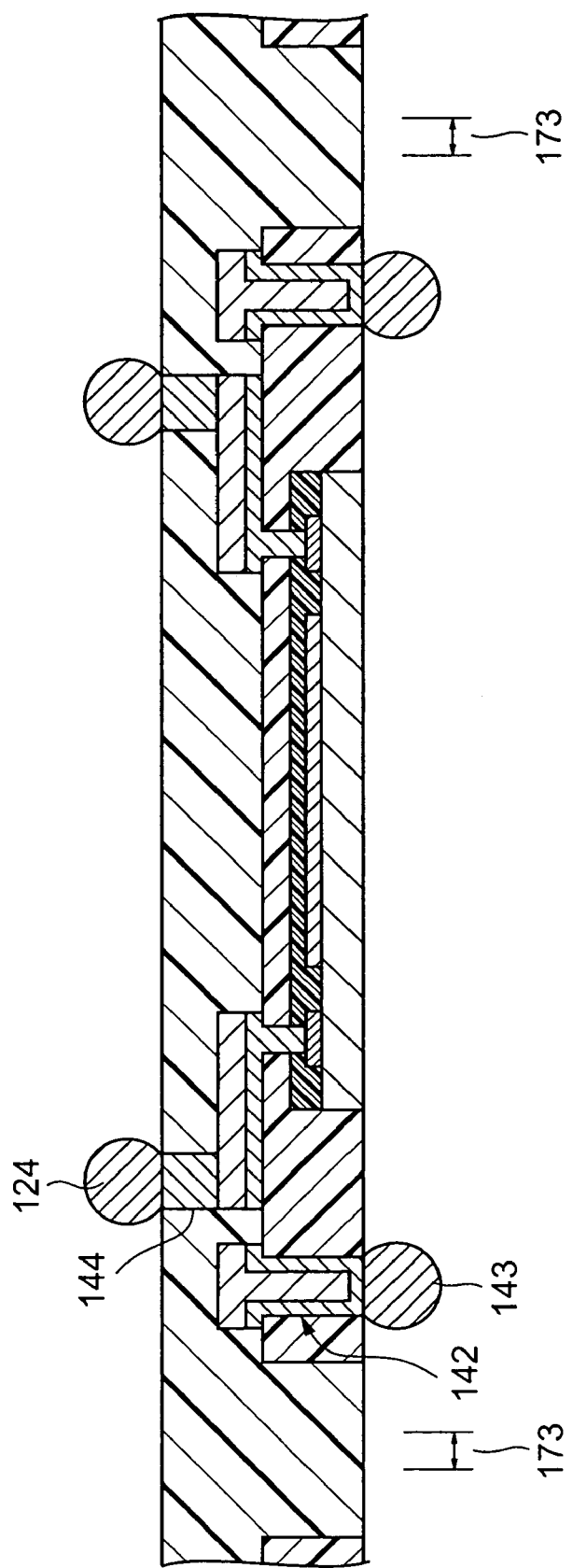
FIG. 50 is a sectional view of a process for explaining an additional example of a manufacturing method of an optical sensor and a semiconductor device.

And in the above-mentioned embodiment, for example, as shown in FIG. 37, the solder balls 124 are formed on the lower surface of the optical sensor 111. However, the solder balls may also be formed on both surface sides of the semiconductor structure 131, without forming the solder balls 124 on the lower surface of the optical sensor 111. In other words, after the process shown in FIG. 45, the solder balls 143 are formed below the penetrating electrodes 142, and the solder balls 124 are formed on the pillar-shaped electrodes 144. This state is shown in FIG. 50. And without forming the solder balls 143 on the lower surface of the semiconductor structure 131, for example, solder layers can be formed on the connection pads 203 of the circuit board 201. Further, either one or both of the bonding of the optical sensor 111 and the semiconductor structure 131, and the bonding of the semiconductor structure 131 and the circuit board 201, can be executed by using an anisotropic conductive adhesive in which conductive particles are mixed in a thermosetting resin, or a conductive adhesive, by not using solder balls.

And the semiconductor structure 131 is explained in a case that the optical sensor 111 is mounted on the semiconductor structure 131 in a state that the main surface on which the integrated circuit 133 formed was directed in the upper side, however, the optical sensor 111 can be mounted on the semiconductor structure 131 in a state that the surface on which the integrated circuit 133 was formed is directed in the lower side. That is, the optical sensor 111 and the semiconductor structure 131 shown in the fifth embodiment can be applied to the second embodiment shown in FIG. 2.

In this case, the optical sensor 35 shown in FIG. 2 can be mounted on the semiconductor structure 131. And the optical sensor 111 shown in the fifth embodiment can be mounted on the semiconductor structure 5 shown in FIG. 2.

And also, at the fifth embodiment, as shown in the first embodiment, only the pillar-shaped electrodes 144 can be situated at the upper surface side of the silicon substrate 132, without forming the penetrating electrodes 142 in the semiconductor structure 131. In this case, as an example, the pillar-shaped electrodes 144 connecting to the flexible wiring plate 29 can be connected to the wiring 22 of the flexible wiring plate 29 by forming wiring extending on the insulation layer 37.

And at the above-mentioned embodiment, as shown in FIG. 30 and FIG. 38, the configuration, in which on the upper surface of the holding plate 161 (171) composed of the ultraviolet ray transmitting glass plate, the transparent metal plate, the transparent resin plate, etc.; the adhesive layer 162 (172) whose adhesive strength is lowered by radiating ultraviolet rays is situated, is used, however, the embodiment is not limited to this. For example, as the holding plate 161 (171), copper foil is used, and as the adhesive layer 162 (172), a material made of a die bonding material is used, and these are removed by etching, polishing, etc., this is also possible.

Further, at the above-mentioned embodiment, the semiconductor structure 131, in which the pillar-shaped electrodes 144 were formed on its upper surface side, is used, however, the embodiment is not limited to this. As the semiconductor structure 131, a configuration in which the pillar-shaped electrodes 144 and the sealing film 145 are not provided; the wiring 141 having the connection pad part is provided as the electrodes for connecting to an external device; and an overcoat film covering the connection pad part of the wiring 141 is provided, can be used.

While the present invention has been described with reference to the preferred embodiments, it is intended that the invention be not limited by any of the details of the description therein but includes all the embodiments which fall within the scope of the appended claims.

What is claimed is:

1. An optical sensor module comprising:
    an optical sensor comprising a first semiconductor substrate, a photoelectric conversion device area provided on an upper surface of the first semiconductor substrate and a plurality of connection pads connected to the photoelectric conversion device area;
    a semiconductor structure comprising a second semiconductor substrate having an integrated circuit provided thereon and a plurality of electrodes for external connection formed on the second semiconductor substrate;
    an insulating layer formed on a periphery of the semiconductor structure;
    an insulating film formed on the insulating layer; and
    a first wiring connecting at least one of the electrodes of the semiconductor structure to one of the connection pads of the optical sensor.

2. The optical sensor module according to claim 1, wherein the electrodes are pillar-shaped, and the semiconductor structure further comprises a plurality of connection pads formed on the second semiconductor substrate;
    wherein at least one of the electrodes is electrically connected to one of the connection pads and a sealant film formed between the electrodes on the second semiconductor substrate.

3. The optical sensor module according to claim 1, wherein the first wiring is formed on the insulating film.

4. The optical sensor module according to claim 1, wherein the optical sensor comprises a first semiconductor substrate which has the photoelectric conversion device area provided thereon, a protective film formed on the first semiconductor substrate, and an insulation layer formed on a periphery of the first semiconductor substrate.

5. The optical sensor module according to claim 4, wherein the optical sensor further comprises an upper surface wiring provided on the insulation layer.

6. The optical sensor module according to claim 4, wherein the optical sensor comprises a plurality of penetrating electrodes which penetrate the insulation layer of the optical sensor in a thickness direction.

7. The optical sensor module according to claim 6, wherein the penetrating electrodes project on a lower surface of the insulation layer of the optical sensor.

8. The optical sensor module according to claim 1, further comprising:
    a baseplate which supports the semiconductor structure and the insulating layer;
    wherein the first wiring is formed on the semiconductor structure and the insulating layer and is connected to the electrodes of the semiconductor structure.

9. The optical sensor module according to claim 1, wherein the first wiring has a connection pad part, and the optical sensor module further comprises an overcoat film which covers areas except for the connection pad part of the first wiring on the semiconductor structure and the insulating layer; and
    wherein the optical sensor is carried on the overcoat film.

10. The optical sensor module according to claim 1, further comprising:
    a baseplate which supports the semiconductor structure and the insulating layer;
    wherein at least one of the electrodes is arranged facing toward the baseplate and an opposite direction above the baseplate.

11. The optical sensor module according to claim 1, wherein the semiconductor structure further comprises a vertical conduction part which penetrates the insulating layer in a thickness direction.

12. The optical sensor module according to claim 11, wherein the vertical conduction part contains some of the first wiring.

13. The optical sensor module according to claim 1, wherein the one of the connection pads of the optical sensor, to which the at least one of the electrodes of the semiconductor structure is connected, is connected to the first wiring via a bonding wire.

14. The optical sensor module according to claim 1, wherein the optical sensor comprises lower surface wiring that is electrically connected to the first wiring on a lower surface of the optical sensor; and
    wherein the optical sensor module further comprises a solder layer which connects the first wiring to the lower surface wiring.

15. The optical sensor module according to claim 1, further comprising:
    a baseplate which supports and separates the semiconductor structure and the optical sensor;
    wherein the insulating layer is formed around the semiconductor structure and the optical sensor on the baseplate.

16. The optical sensor module according to claim 1, wherein an electronic component is embedded in the insulating layer.

17. The optical sensor module according to claim 1, further comprising a glass plate which reduces ultraviolet rays and which is formed on the upper surface of the optical sensor.

18. The optical sensor module according to claim 1, wherein the optical sensor is mounted on the semiconductor structure and an entire thickness thereof is from 0.6 mm to 1 mm.

19. The optical sensor module according to claim 1, wherein a lens is oriented on an upper side of the optical sensor.

20. An optical sensor module comprising:
an optical sensor comprising a first semiconductor substrate, a photoelectric conversion device area provided on an upper surface of the first semiconductor substrate, a plurality of connection pads connected to the photoelectric conversion device area, and a first wiring;
a semiconductor structure comprising a second semiconductor substrate having an integrated circuit provided thereon and a plurality of electrodes for external connection formed on the second semiconductor substrate; and
an insulating layer formed on an inside area of the semiconductor structure;
wherein at least one of the electrodes of the semiconductor structure is connected by a connection member to one of the connection pads of the optical sensor.

21. The optical sensor module according to claim 20, wherein the electrodes are pillar-shaped, and the semiconductor structure of the second semiconductor substrate further comprises a plurality of connection pads formed on the second semiconductor substrate;
wherein at least one of the electrodes is electrically connected to one of the connection pads and a sealant film formed between the electrodes on the second semiconductor substrate.

22. The optical sensor module according to claim 20, wherein the semiconductor structure and the insulating layer have a same bottom surface.

23. The optical sensor module according to claim 20, wherein the semiconductor structure comprises penetrating electrodes which penetrate the insulating layer in a thickness direction.

24. The optical sensor module according to claim 23, wherein the semiconductor structure further comprises a second wiring formed on the insulation layer.

25. The optical sensor module according to claim 24, wherein the electrodes for external connection are pillar-shaped and project in an opposite direction against the penetrating electrodes.

26. The optical sensor module according to claim 20, wherein the optical sensor comprises a first semiconductor substrate which has the photoelectric conversion device area provided thereon, a protective film formed on the first semiconductor substrate, and an the insulation layer formed on a periphery of the first semiconductor substrate.

27. The optical sensor module according to claim 26, wherein the first wiring is formed on the insulation layer of the optical sensor.

28. The optical sensor module according to claim 26, wherein the optical sensor comprises penetrating electrodes which penetrate the insulation layer of the optical sensor in a thickness direction.

29. The optical sensor module according to claim 28, wherein the penetrating electrodes project on an upper surface of the insulation layer of the optical sensor.

30. The optical sensor module according to claim 26, wherein the first semiconductor substrate and the insulation layer of the optical sensor have a same bottom surface.

31. The optical sensor module according to claim 20, further comprising a glass plate, for blocking ultraviolet rays, which is formed on the upper surface of the optical sensor.

32. The optical sensor module according to claim 20, wherein the optical sensor is mounted on the semiconductor structure and an entire thickness thereof is from 0.6 mm to 1 mm.

33. The optical sensor module according to claim 20, wherein a lens is oriented on an upper side of the optical sensor.

34. An optical sensor module comprising:
an optical sensor comprising a semiconductor substrate, a photoelectric conversion device area provided on an upper surface of the semiconductor substrate and a plurality of connection pads connected to the photoelectric conversion device area;
a semiconductor structure having a plurality of electrodes for external connection;
an insulating layer formed on a periphery of the semiconductor structure;
a first wiring formed on at least one of the semiconductor structure and the optical sensor and connecting at least one of the electrodes of the semiconductor structure to one of the connection pads of the optical sensor; and
a base plate which supports the semiconductor structure and the insulating layer;
wherein at least one of the electrodes is arranged facing toward the base plate and an opposite surface side above the base plate.

35. The optical sensor module according to claim 34, wherein at least one of the connection pads of a semiconductor chip is connected through the first wiring to one of the electrodes of the semiconductor structure.

* * * * *